United States Patent
Kobayashi

(10) Patent No.: US 10,484,632 B2
(45) Date of Patent: Nov. 19, 2019

(54) IMAGING ELEMENT AND IMAGING DEVICE

(71) Applicant: FUJIFILM Corporation, Tokyo (JP)

(72) Inventor: Makoto Kobayashi, Saitama (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 16/363,549

(22) Filed: Mar. 25, 2019

(65) Prior Publication Data

US 2019/0222786 A1    Jul. 18, 2019

Related U.S. Application Data

(63) Continuation of application No. PCT/JP2017/029201, filed on Aug. 10, 2017.

(30) Foreign Application Priority Data

Sep. 27, 2016  (JP) .................................. 2016-188705

(51) Int. Cl.
*H04N 5/369* (2011.01)
*H01L 27/146* (2006.01)
(Continued)

(52) U.S. Cl.
CPC ........... *H04N 5/36961* (2018.08); *G02B 7/34* (2013.01); *G03B 13/36* (2013.01); *H01L 27/146* (2013.01);
(Continued)

(58) Field of Classification Search
CPC ............................................... H04N 5/36961
(Continued)

(56) References Cited

U.S. PATENT DOCUMENTS

2004/0262703 A1* 12/2004 Kanbe ............... H01L 27/14601
257/431
2012/0188425 A1    7/2012 Kita
(Continued)

FOREIGN PATENT DOCUMENTS

| JP | 2011-243735 A | 12/2011 |
| JP | 2012-151774 A | 8/2012 |

(Continued)

OTHER PUBLICATIONS

International Preliminary Report on Patentability, dated Feb. 6, 2018, and Written Opinion of the International Searching Authority, dated Oct. 31, 2017, (Forms PCT/IPEA/409, and PCT/ISA/237) for International Application No. PCT/JP2017/029201, with partial English translation.

(Continued)

*Primary Examiner* — Joel W Fosselman
(74) *Attorney, Agent, or Firm* — Birch, Stewart, Kolasch & Birch, LLP

(57) ABSTRACT

An imaging element that images a subject through an imaging optical system, and includes a plurality of pairs each including a photoelectric conversion unit which is formed within a semiconductor substrate, receives one of a pair of luminous flux passed through different portions arranged in one direction of a pupil area of the imaging optical system, and accumulates electric charges corresponding to a light reception amount, and a photoelectric conversion unit which is formed within the semiconductor substrate, receives the other one of the pair of luminous flux, and accumulates electric charges corresponding to a light reception amount, each of pixels including the photoelectric conversion units constituting the pair includes an electric charge retaining unit as defined herein, and when being viewed in a direction perpendicular to the semiconductor (Continued)

substrate, the electric charge retaining unit included in the pixel is disposed in an area as defined herein.

4 Claims, 21 Drawing Sheets

(51) Int. Cl.
    *H04N 5/3745* (2011.01)
    *H04N 5/378* (2011.01)
    *G02B 7/34* (2006.01)
    *G03B 13/36* (2006.01)
    *H04N 5/374* (2011.01)

(52) U.S. Cl.
    CPC .. *H01L 27/14607* (2013.01); *H01L 27/14623* (2013.01); *H01L 27/14627* (2013.01); *H04N 5/369* (2013.01); *H04N 5/374* (2013.01); *H04N 5/378* (2013.01); *H04N 5/3745* (2013.01)

(58) Field of Classification Search
    USPC ......................................................... 348/294
    See application file for complete search history.

(56) References Cited

U.S. PATENT DOCUMENTS

| | | |
|---|---|---|
| 2013/0120644 A1 | 5/2013 | Fujii |
| 2013/0194471 A1 | 8/2013 | Yamashita |
| 2014/0022354 A1 | 1/2014 | Okigawa et al. |
| 2015/0109499 A1 | 4/2015 | Yamashita |
| 2016/0353040 A1 | 12/2016 | Yamashita |
| 2016/0372503 A1 | 12/2016 | Okuno et al. |
| 2017/0280080 A1 | 9/2017 | Machida et al. |
| 2018/0211987 A1 | 7/2018 | Okuno et al. |
| 2018/0234651 A1 | 8/2018 | Machida et al. |

FOREIGN PATENT DOCUMENTS

| | | |
|---|---|---|
| JP | 2013-157883 A1 | 8/2013 |
| JP | 2015-204381 A | 11/2015 |
| WO | WO 2012/023355 A1 | 2/2012 |
| WO | WO 2012/132670 A1 | 10/2012 |
| WO | WO 2015/002006 A1 | 1/2015 |
| WO | WO 2016/098624 A1 | 6/2016 |

OTHER PUBLICATIONS

International Search Report (Form PCT/ISA/210) for International Application No. PCT/JP2017/029201, dated Oct. 31, 2017, with English translation.

* cited by examiner

IMAGING ELEMENT AND IMAGING DEVICE

CROSS REFERENCE TO RELATED APPLICATION

This is a continuation of International Application No. PCT/JP2017/029201 filed on Aug. 10, 2017, and claims priority from Japanese Patent Application No. 2016-188705 filed on Sep. 27, 2016, the entire disclosures of which are incorporated herein by reference.

BACKGROUND OF THE INVENTION

1. Field of the Invention

The present invention relates to an imaging element and an imaging device.

2. Description of the Related Art

With an increase in resolution of imaging elements, such as a charge coupled device (CCD) image sensor and a complementary metal oxide semiconductor (CMOS) image sensor, there is a rapid increase in demand for electronic devices having an imaging function, such as an electronic endoscope, a digital still camera, a digital video camera, and a mobile phone such as a smartphone. The electronic devices having an imaging function described above are referred to as imaging devices.

In these imaging devices, a phase difference auto focus (AF) method is employed as a focusing control method of focusing on a main subject.

For example, an imaging element in which pairs of phase-difference detecting pixels of which light receiving areas of photoelectric conversion units are eccentric to each other in an opposite direction are discretely formed on a light receiving surface is used as an imaging element mounted on an imaging device that performs focusing control by the phase-difference AF method (see JP2012-151774A).

The phase-difference detecting pixel of the imaging element described in JP2012-151774A has a configuration in which a photoelectric conversion unit and an electric charge retaining unit that retains electric charges accumulated in the photoelectric conversion unit are arranged in a detection direction of a phase difference using a pair of phase-difference detecting pixels.

SUMMARY OF THE INVENTION

In the phase-difference detecting pixel, a width of the light receiving area of the photoelectric conversion unit in a phase difference detection direction is less than a width of another normal pixel (imaging pixel). Thus, it is difficult to increase the width of the light receiving area of the photoelectric conversion unit in the phase difference detection direction in a configuration in which the electric charge retaining unit is present adjacent to the photoelectric conversion unit in the phase difference detection direction as in JP2012-151774A.

In the phase-difference detecting pixel, in a case where the width of the light receiving area of the photoelectric conversion unit in the phase difference detection direction approaches a wavelength of light, it is difficult for light to be incident on the light receiving area. As a result, it is difficult to sufficiently secure pixel performance such as oblique Incidence characteristics and sensitivity of the phase-difference detecting pixel.

The present invention has been made in view of the circumstances, and an object of the present invention is to provide an imaging element that includes a pixel including a photoelectric conversion unit and an electric charge retaining unit and is capable of detecting a phase difference, and is capable of sufficiently securing pixel performance of the pixel, and an imaging device comprising the same.

An imaging element of the present invention is an imaging element that images a subject through an imaging optical system. The imaging element comprises a plurality of pairs each including a photoelectric conversion unit which is formed within a semiconductor substrate, receives one of a pair of luminous flux passed through different portions arranged in one direction of a pupil area of the imaging optical system, and accumulates electric charges corresponding to a light reception amount, and a photoelectric conversion unit which is formed within the semiconductor substrate, receives the other one of the pair of luminous flux, and accumulates electric charges corresponding to a light reception amount. Each of pixels including the photoelectric conversion units constituting the pair includes an electric charge retaining unit which retains the electric charges transferred from the photoelectric conversion unit within the pixel and from which a signal corresponding to the electric charges is read out by a read-out circuit, and in a state in which the semiconductor substrate is viewed in a perpendicular direction, the electric charge retaining unit included in the pixel is disposed in an area excluding an area of the pixel indicated by a trajectory in a case where the photoelectric conversion unit included in the pixel is moved in the one direction.

An imaging device of the present invention comprises the imaging element.

According to the present invention, it is possible to provide an imaging element that includes a pixel which includes a photoelectric conversion unit and an electric charge retaining unit and is capable of detecting a phase difference, and is capable of sufficiently securing pixel performance of the pixel, and an imaging device comprising the same.

DESCRIPTION OF THE PREFERRED EMBODIMENTS

Hereinafter, an embodiment of the present invention will be described with reference to the drawings.

Figure 1:
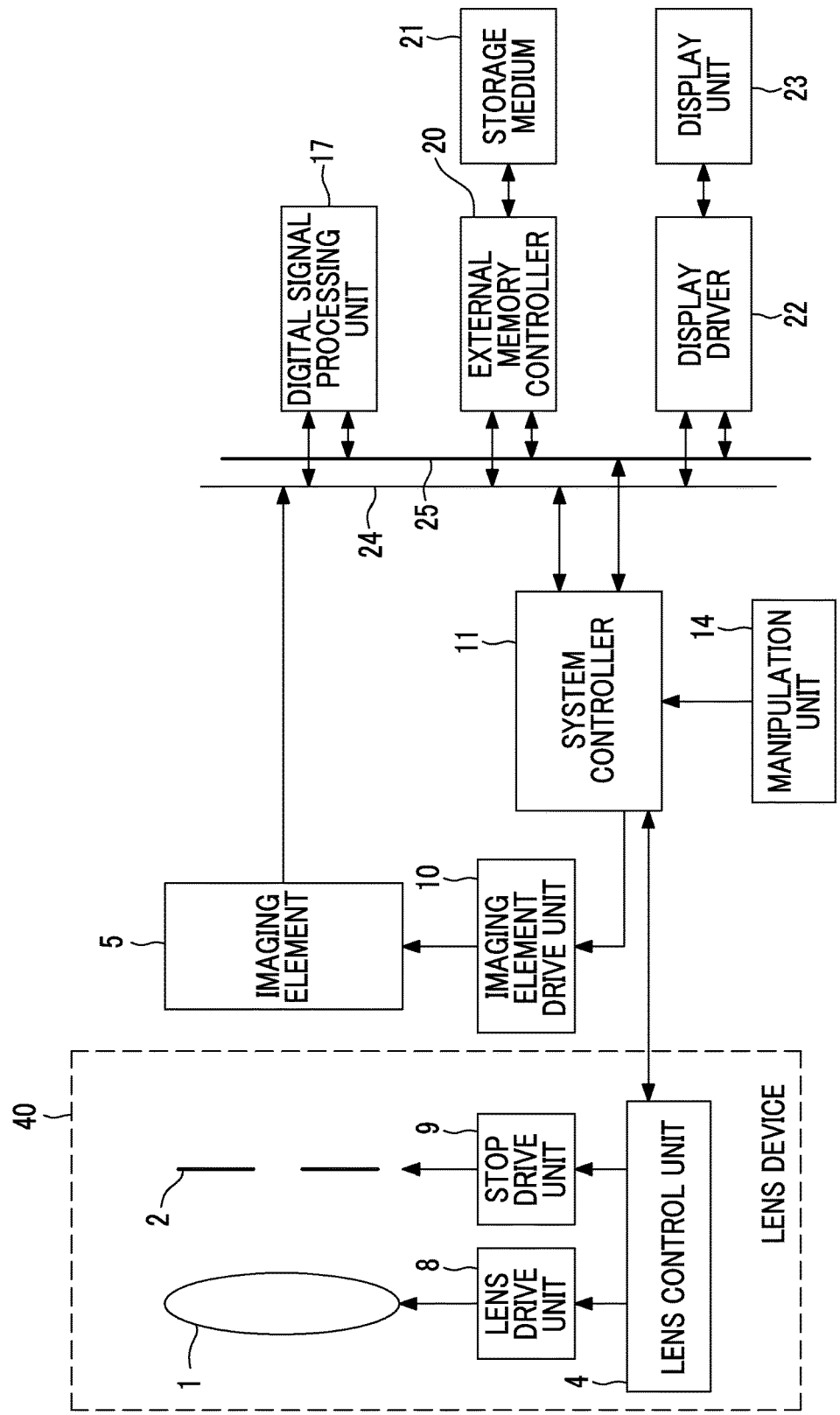
FIG. 1 is a diagram showing a schematic configuration of a digital camera as an example of an imaging device which is an embodiment of the present invention.

FIG. 1 is a diagram showing a schematic configuration of a digital camera as an example of an imaging device which is an embodiment of the present invention.

The digital camera shown in FIG. 1 comprises a lens device 40 which includes an imaging lens 1, a stop 2, a lens controller 4, a lens drive unit 8, and a stop drive unit 9.

Although it will be described in the present embodiment that the lens device 40 is attachable and detachable to a digital camera main body, the lens device may be fixed to the digital camera main body. The imaging lens 1 and the stop 2 constitute an imaging optical system.

The lens controller 4 of the lens device 40 is configured to communicate with a system controller 11 of the digital camera main body in a wired manner or a wireless manner.

According to a command from the system controller 11, the lens controller 4 drives a focus lens included in the imaging lens 1 through the lens drive unit 8 or drives the stop 2 through the stop drive unit 9.

The digital camera main body comprises a MOS type imaging element 5 such as a CMOS image sensor that images a subject through an imaging optical system of the lens device 40, an imaging element drive unit 10 that drives the imaging element 5, a system controller 11 that generally controls the entire electrical control system of the digital camera, a manipulation unit 14, a digital signal processing unit 17, an external memory controller 20 to which an attachable and detachable storage medium 21 is connected, and a display driver 22 that drives a display unit 23 such as an organic electroluminescence (EL) display or a liquid crystal display (LCD) mounted on a camera rear surface.

The system controller 11 includes a processor, a random access memory (RAM), and a read only memory (ROM), and generally controls the entire digital camera. The system controller 11 performs focusing control using a phase difference AF method based on signals output from the imaging element 5.

The digital signal processing unit 17 includes a processor, a RAM, and a ROM, and performs various processing by the processor executing a program stored in the ROM.

The digital signal processing unit 17 generates live view image data to be displayed on the display unit 23 and captured image data to be stored in the storage medium 21 by performing processing such as an interpolation operation, a gamma correction operation, and an RGB/YC conversion processing on a captured image signal constituted by signals output from pixels of the imaging element 5.

The digital signal processing unit 17, the external memory controller 20, and the display driver 22 are connected to each other through a control bus 24 and a data bus 25, and are operated according to a command from the system controller 11.

Figure 2:
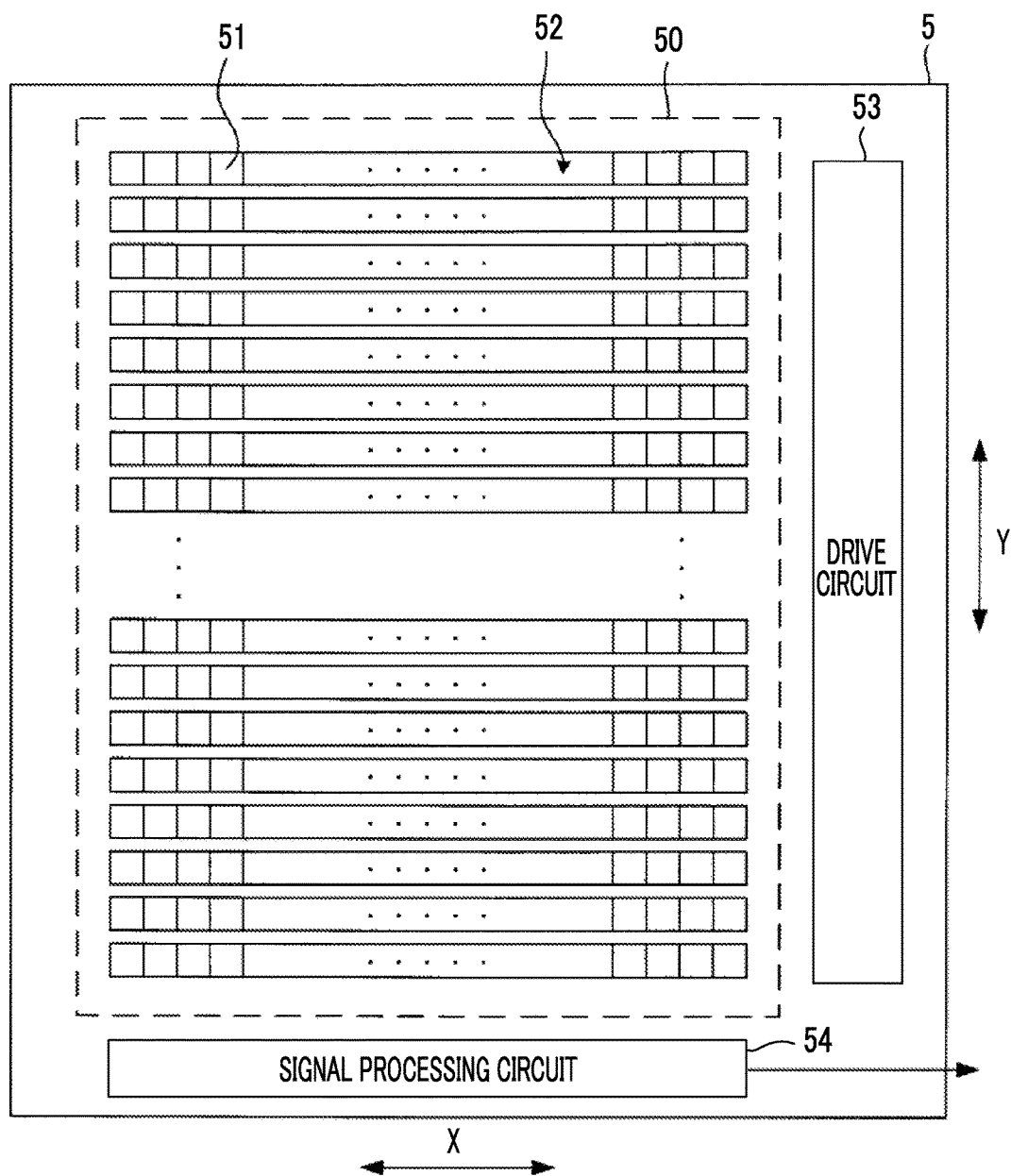
FIG. 2 is a planar schematic diagram showing a schematic configuration of an imaging element 5 shown in FIG. 1.

FIG. 2 is a planar schematic diagram showing a schematic configuration of the imaging element 5 shown in FIG. 1.

The imaging element 5 comprises a light receiving surface 50 on which a plurality of pixel rows 52 each having a plurality of pixels 51 arranged in a row direction X as one direction is arranged in a column direction Y perpendicular to the row direction X, a drive circuit 53 that drives pixels 51 arranged on the light receiving surface 50, and a signal processing circuit 54 that processes signals read out from the pixels 51 of the pixel rows 52 arranged on the light receiving surface 50 into a signal line. The pixels 51 formed on the light receiving surface 50 are formed on a semiconductor substrate such as silicon.

The plurality of pixels 51 formed on the light receiving surface 50 includes phase-difference detecting pixels for detecting a phase difference between two images based on a pair of luminous flux passed through two different portions arranged in a row direction X of a pupil area of the imaging optical system of the lens device 40 and imaging pixels 51A receiving both the pair of luminous flux.

Each of the phase-difference detecting pixels formed on the light receiving surface 50 includes a first pixel 51R including a photoelectric conversion unit which receives one of the pair of luminous flux and accumulates electric charges corresponding to a light reception amount, and a second pixel 51L including a photoelectric conversion unit which receives the other of the pair of luminous flux and accumulates electric charges corresponding to a light reception amount.

The first pixel 51R and the second pixel 51L are paired, and a plurality of pairs of first and second pixels is arranged on the light receiving surface 50. The system controller 11 calculates a phase difference based on signals read out from the plurality of pairs, and controls a focus lens to perform focusing control based on the calculated phase difference.

Figure 3:
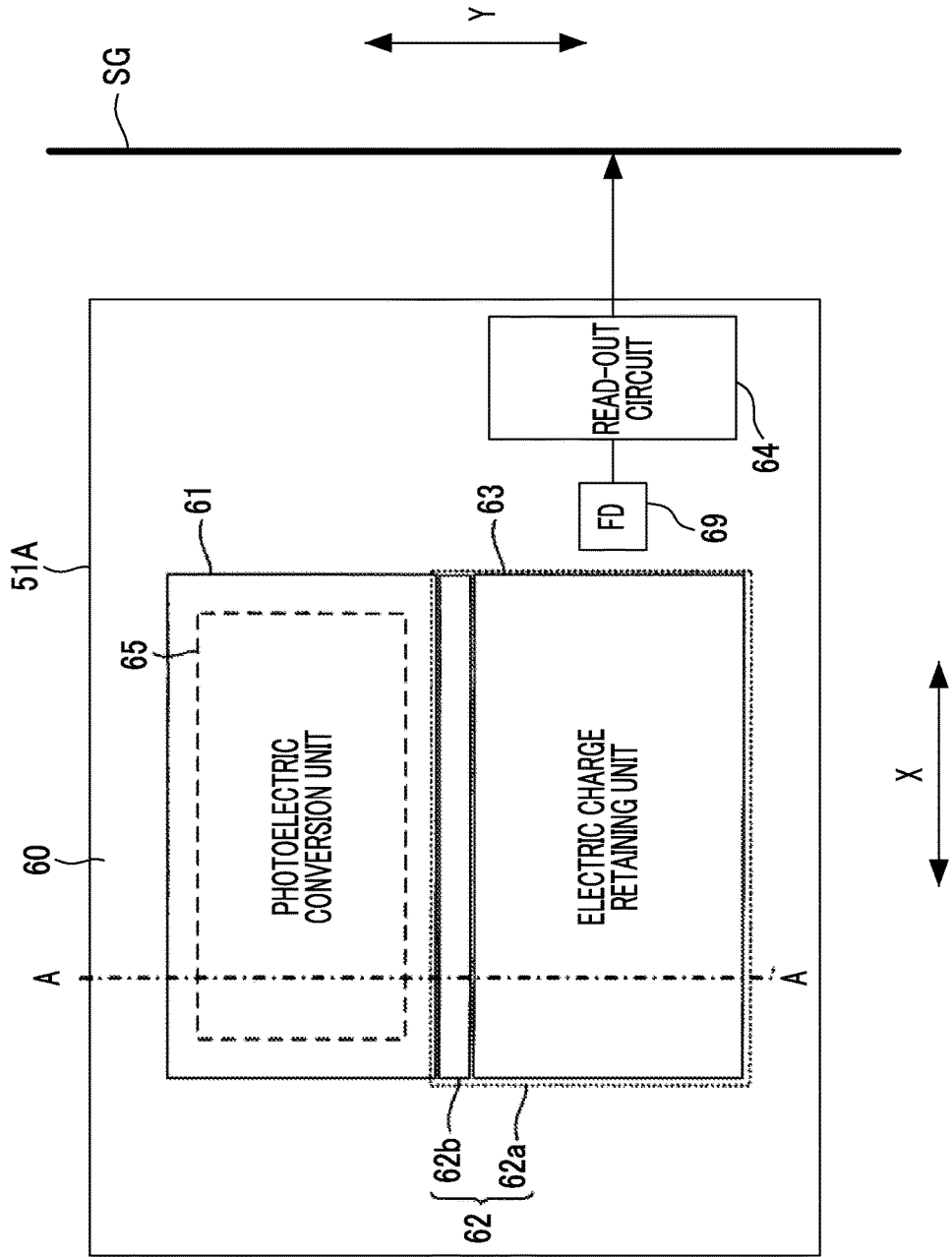
FIG. 3 is a planar schematic diagram showing a schematic configuration of an imaging pixel 51A formed on a light receiving surface 50 shown in FIG. 2.
Figure 4:
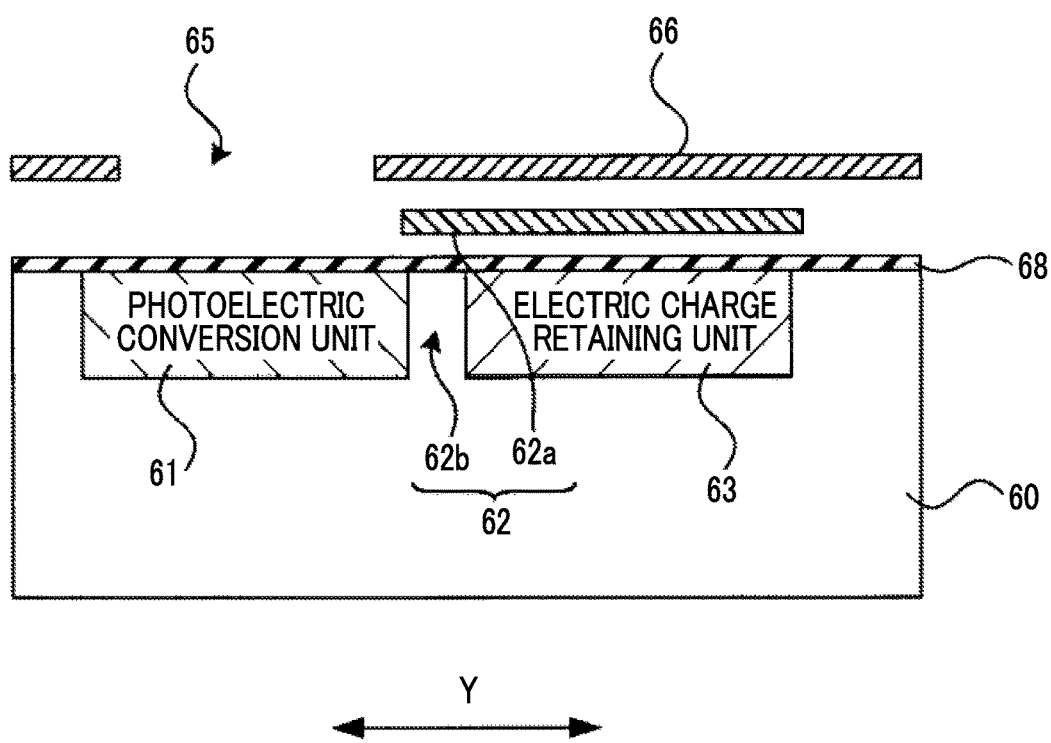
FIG. 4 is a schematic diagram of a cross section taken along a line A-A shown in FIG. 3.

FIG. 3 is a planar schematic diagram showing a schematic configuration of the imaging pixel 51A formed on the light receiving surface 50 shown in FIG. 2. FIG. 4 is a schematic diagram of a cross section taken along a line A-A shown in FIG. 3. FIG. 3 shows a state in a case where a front surface of a semiconductor substrate 60 on which each pixel 51 is formed is viewed in a perpendicular direction.

The imaging pixel 51A comprises a photoelectric conversion unit 61, an electric charge transfer unit 62, an electric charge retaining unit 63, a floating diffusion 69, a read-out circuit 64, and a light shielding film 66 (see FIG. 4) that shields a part of the photoelectric conversion unit 61, the electric charge transfer unit 62, the electric charge retaining unit 63, the floating diffusion 69, and the read-out circuit 64.

The photoelectric conversion unit 61 receives light passed through the imaging optical system of the lens device 40, generates electric charges corresponding to the light reception amount, and accumulates the generated electric charges. The photoelectric conversion unit 61 is constituted by a photodiode formed within the semiconductor substrate 60.

The electric charge retaining unit 63 retains the electric charges accumulated in the photoelectric conversion unit 61. The electric charge retaining unit 63 is constituted by am purity area within the semiconductor substrate 60.

The photoelectric conversion unit 61 and the electric charge retaining unit 63 are arranged so as to be spaced apart from each other in the column direction Y within the semiconductor substrate 60.

The electric charge transfer unit 62 transfers the electric charges accumulated in the photoelectric conversion unit 61 to the electric charge retaining unit 63.

As shown in FIGS. 3 and 4, the electric charge transfer unit 62 is constituted by a transfer channel 62b formed in an area between the photoelectric conversion unit 61 and the electric charge retaining unit 63 within the semiconductor substrate 60, and a transfer electrode 62a formed above the transfer channel 62b and the electric charge retaining unit 63 through an oxide film 68. Although the transfer electrode 62a is formed above the electric charge retaining unit 63 in the example of FIGS. 3 and 4, the transfer electrode 62a may be formed above only the transfer channel 62b.

A voltage applied to the transfer electrode 62a is controlled by the drive circuit 53, and thus, the electric charges accumulated in the photoelectric conversion unit 61 are transferred to the electric charge retaining unit 63 via the transfer channel 62b.

The floating diffusion 69 is used for converting the electric charge into the voltage, and the electric charges retained in the electric charge retaining unit 63 are transferred. A reading electrode (not shown) is formed above the semiconductor substrate between the electric charge retaining unit 63 and the floating diffusion 69. The voltage applied to the reading electrode is controlled by the drive circuit 53, and thus, the electric charges retained in the electric charge retaining unit 63 are transferred to the floating diffusion 69.

As shown in FIG. 4, the light shielding film 66 is formed above the photoelectric conversion unit 61, the electric charge transfer unit 62, the electric charge retaining unit 63, the floating diffusion 69, and the read-out circuit 64.

An opening 65 of the light shielding film 66 is formed above the photoelectric conversion unit 61. A center of the opening 65 of the light shielding film 66 matches a center of the photoelectric conversion unit 61.

The photoelectric conversion unit 61 receives light passed through the imaging optical system through the opening 65. In FIG. 3, a portion of the photoelectric conversion unit 61 which overlaps the opening 65 of the light shielding film 66 constitutes a light receiving area of the photoelectric conversion unit 61.

The read-out circuit 64 shown in FIG. 3 is a circuit that converts the electric charges retained in the electric charge retaining unit 63 into signals and reads out the signals into a signal line SG, and can adopt the well-known configuration. The read-out circuit 64 is driven by the drive circuit 53.

For example, the read-out circuit 64 includes a reset transistor for resetting potential of the floating diffusion 69, an output transistor that converts the potential of the floating diffusion 69 into the signals and outputs the converted signals, and a selection transistor for selectively reading out the signals output from the output transistor into the signal line SG.

The read-out circuit 64 is commonly used by another adjacent pixel 51 in some cases.

Figure 5:
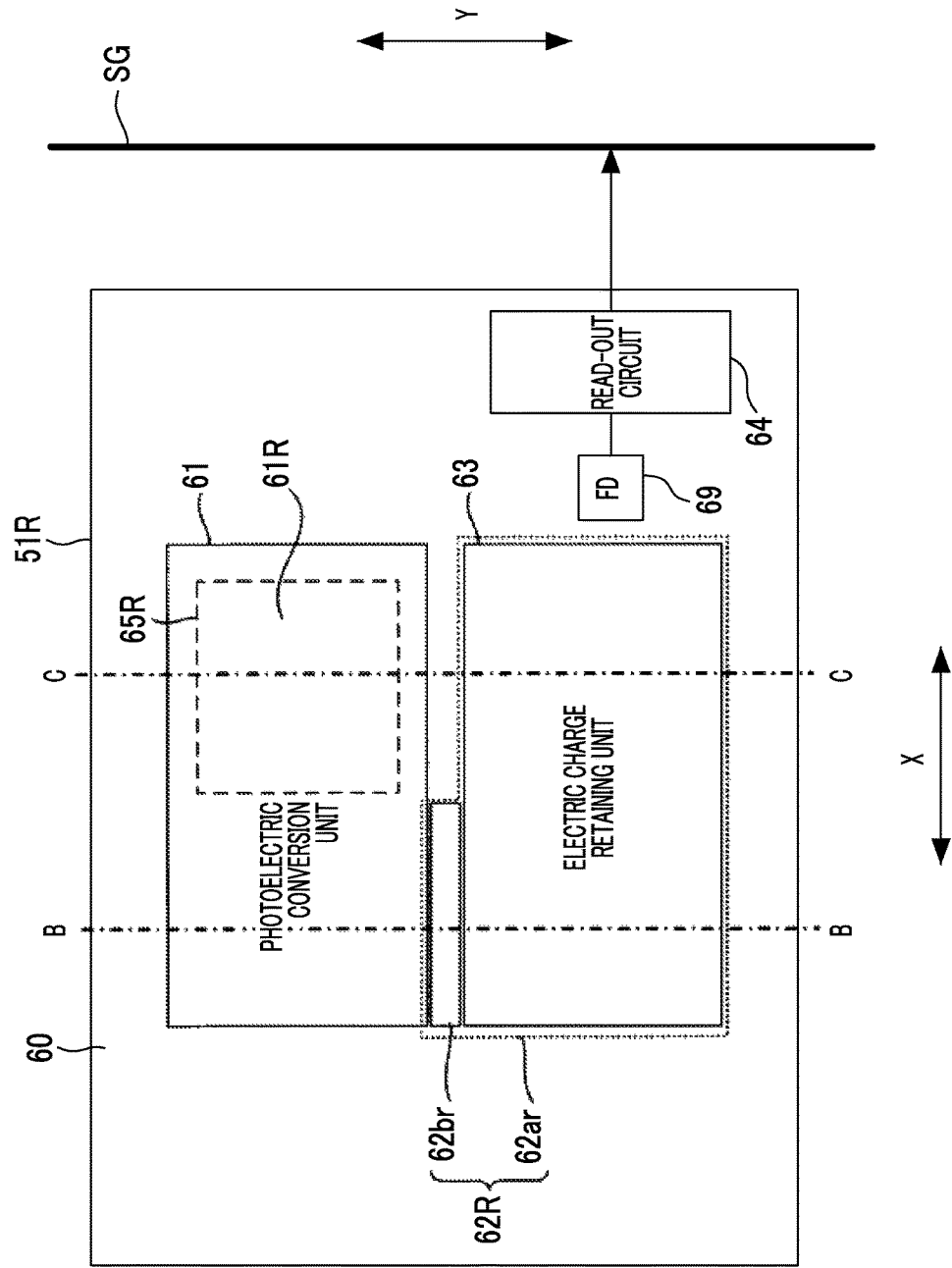
FIG. 5 is a planar schematic diagram showing a schematic configuration of a first pixel 51R as a phase-difference detecting pixel formed on the light receiving surface 50 shown in FIG. 2.
Figure 6:
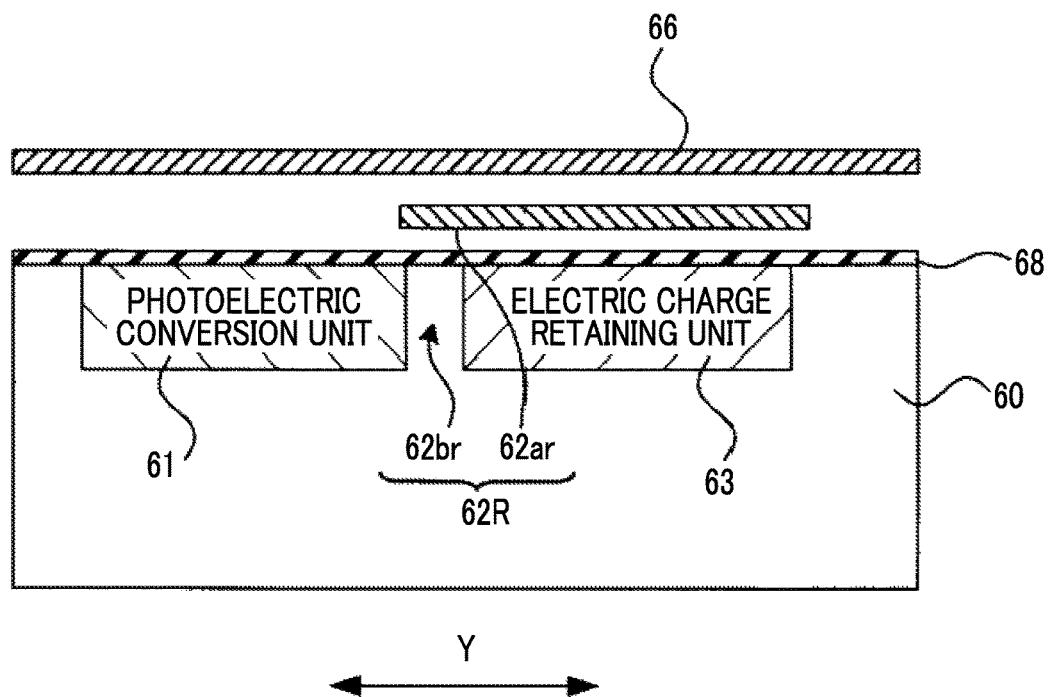
FIG. 6 is a schematic diagram of a cross section taken along a line B-B shown in FIG. 5.
Figure 7:
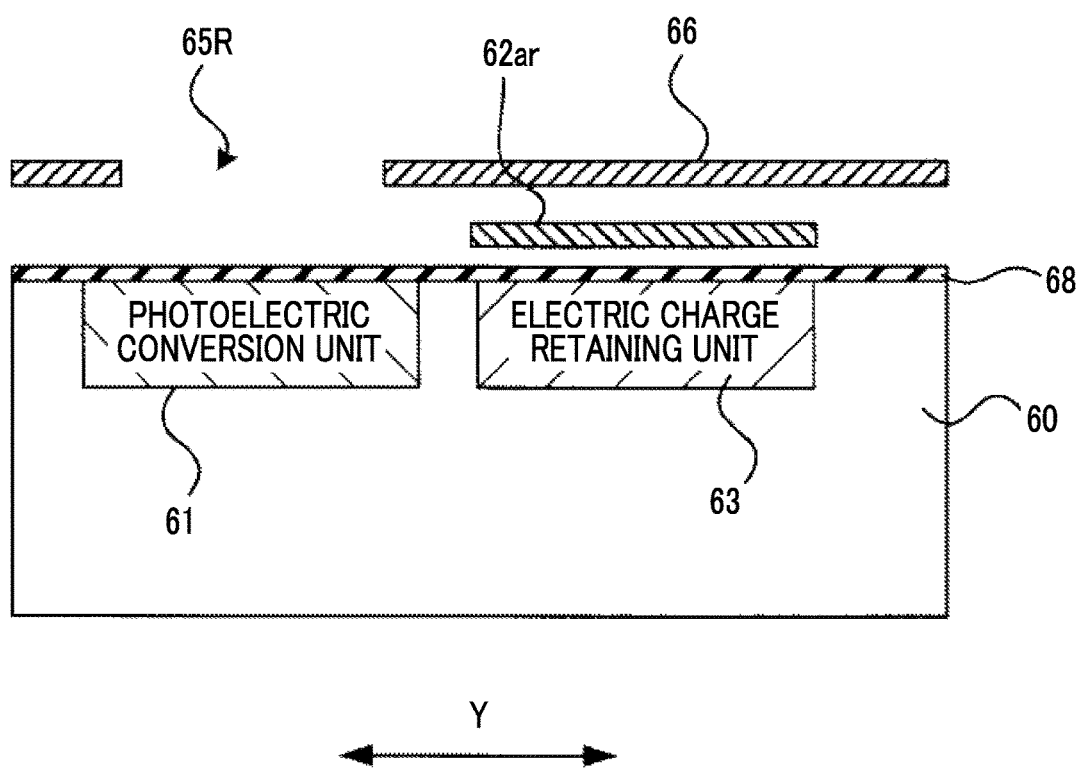
FIG. 7 is a schematic diagram of a cross section taken along a line C-C shown in FIG. 5.

FIG. 5 is a planar schematic diagram showing a schematic configuration of the first pixel 51R as the phase-difference detecting pixel formed on the light receiving surface 50 shown in FIG. 2. FIG. 6 is a schematic diagram of a cross section taken along a line B-B shown in FIG. 5. FIG. 7 is a schematic diagram of a cross section taken along a line C-C shown in FIG. 5. FIG. 5 shows a state in a case where the front surface of the semiconductor substrate 60 is viewed in the perpendicular direction.

The first pixel 51R comprises a photoelectric conversion unit 61, an electric charge transfer unit 62R, an electric charge retaining unit 63, a read-out circuit 64, a floating diffusion 69, and a light shielding film 66 (see FIGS. 6 and 7) that shields a part of the photoelectric conversion unit 61, the electric charge transfer unit 62R, the electric charge retaining unit 63, the floating diffusion 69, and the read-out circuit 64.

The configurations of the photoelectric conversion unit 61, the electric charge retaining unit 63, the floating diffusion 69, and the read-out circuit 64 included in the first pixel 51R are the same as the configurations of those in the imaging pixel 51A.

The light shielding film 66 of the first pixel 51R has an opening 65R above the photoelectric conversion unit 61. A center of the opening 65R is eccentric to the right in the row direction X with respect to a center of the photoelectric conversion unit 61. The photoelectric conversion unit 61 of the first pixel 51R receives light passed through a right half portion of the pupil area of the imaging optical system in the row direction X through the opening 65R.

In FIG. 5, a portion of the photoelectric conversion unit 61 which overlaps the opening 65R of the light shielding film 66 constitutes a light receiving area 61R of the photoelectric conversion unit 61 of the first pixel 51R.

The electric charge transfer unit 62R transfers the electric charges accumulated in the photoelectric conversion unit 61 to the electric charge retaining unit 63.

As shown in FIGS. 5 and 6, the electric charge transfer unit 62R is constituted by a transfer channel 62br formed between an area excluding an area indicated by a trajectory in a case where the light receiving area 61R of the photoelectric conversion unit 61 is moved in the column direction Y and the electric charge retaining unit 63, and a transfer electrode 62ar formed above the transfer channel 62br and the electric charge retaining unit 63 through an oxide film 68.

Although the transfer electrode 62ar is formed above the electric charge retaining unit 63 in the example of FIGS. 5 and 6, the transfer electrode 62ar may be formed above only the transfer channel 62br.

A voltage applied to the transfer electrode 62ar is controlled by the drive circuit 53, and thus, the electric charges accumulated in the photoelectric conversion unit 61 are transferred to the electric charge retaining unit 63 through the transfer channel 62br.

Figure 8:
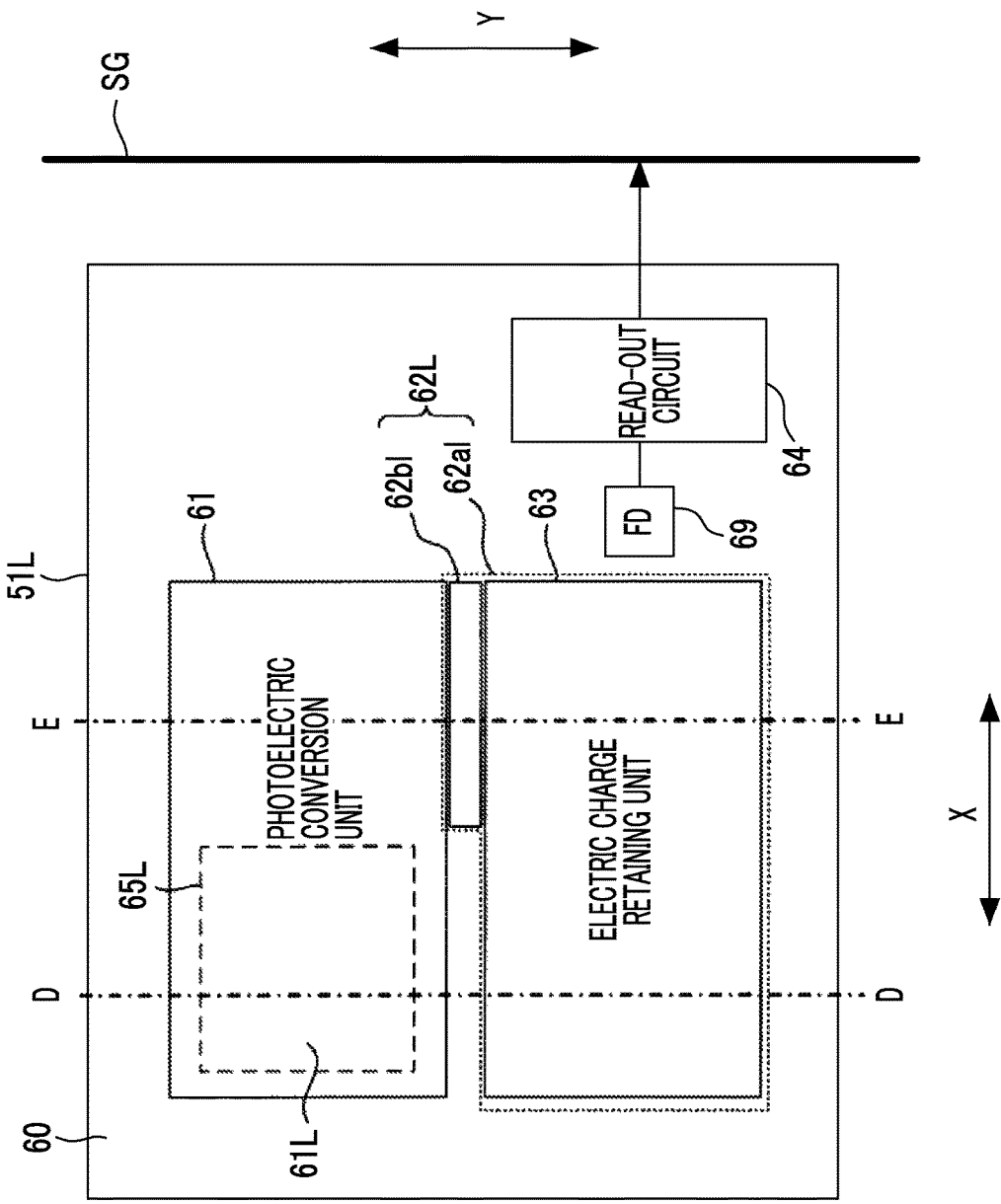
FIG. 8 is a planar schematic diagram showing a schematic configuration of a second pixel 51L as the phase-difference detecting pixel formed on the light receiving surface 50 shown in FIG. 2.
Figure 9:
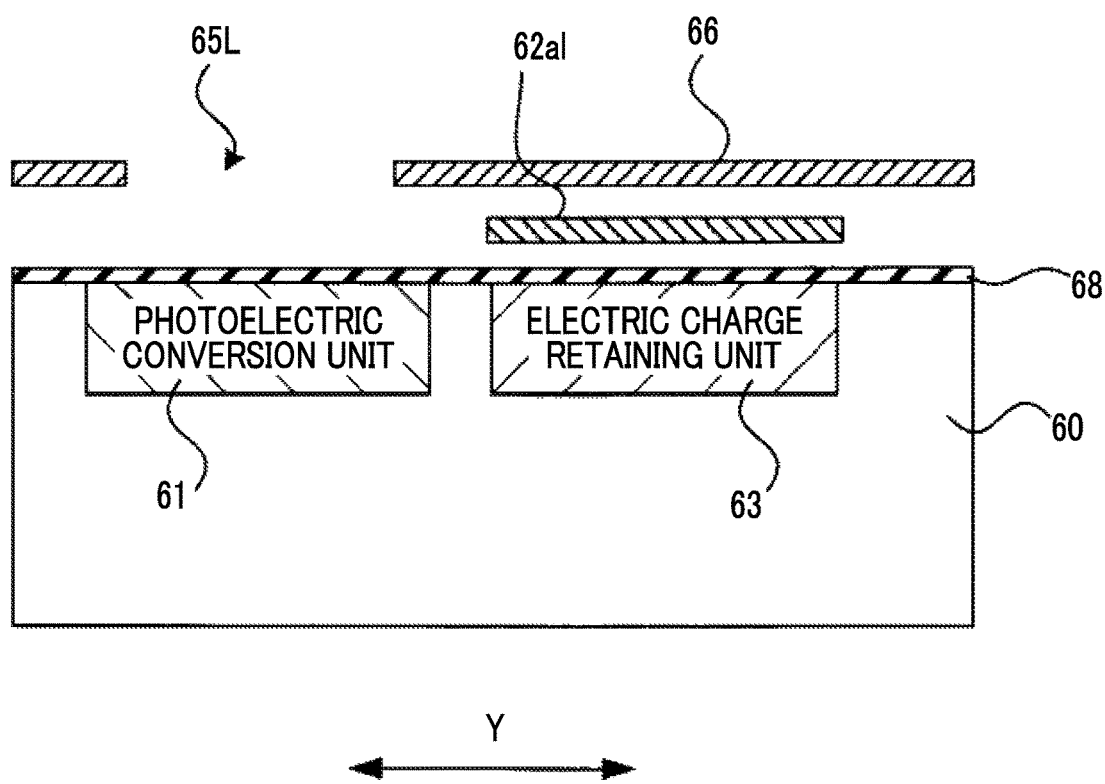
FIG. 9 is a schematic diagram of a cross section taken along a line D-D shown in FIG. 8.
Figure 10:
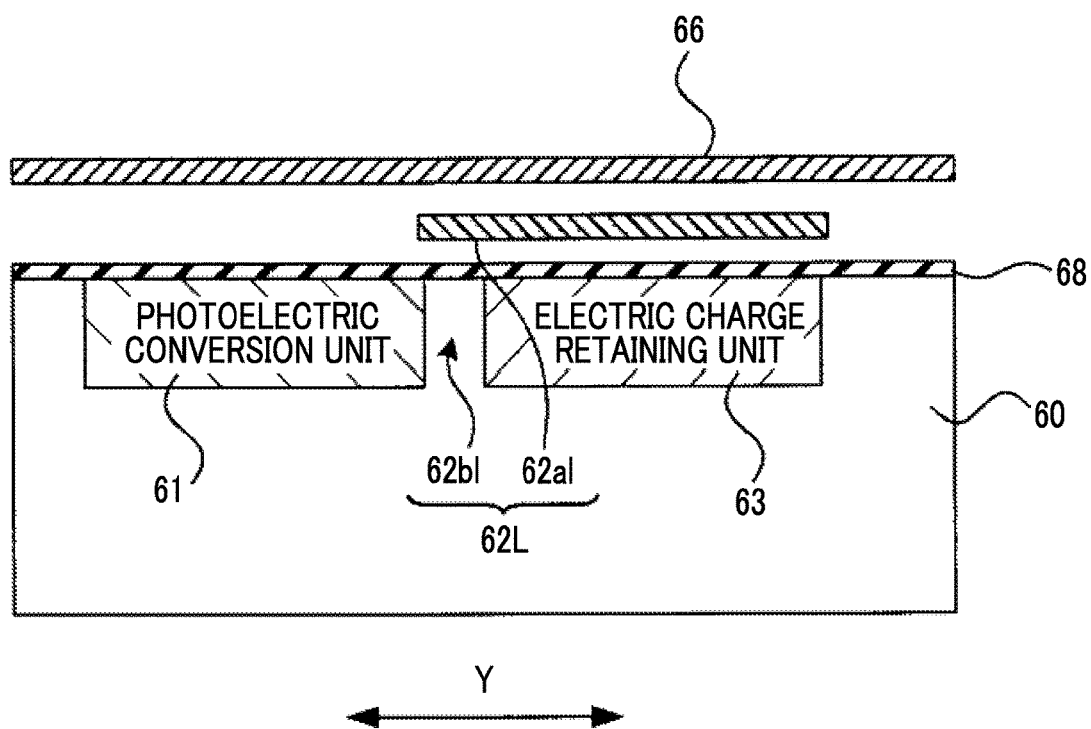
FIG. 10 is a schematic diagram of a cross section taken along a line E-E shown in FIG. 8.

FIG. 8 is a planar schematic diagram showing a schematic configuration of the second pixel 51L as the phase-difference detecting pixel formed on the light receiving surface 50 shown in FIG. 2. FIG. 9 is a schematic diagram of a cross section taken along a line D-D shown in FIG. 8. FIG. 10 is a schematic diagram of a cross section taken along a line E-E shown in FIG. 8. FIG. 8 shows a state in a case where the front surface of the semiconductor substrate 60 is viewed in the perpendicular direction.

The second pixel 51L comprises a photoelectric conversion unit 61, an electric charge transfer unit 62L, an electric charge retaining unit 63, a read-out circuit 64, a floating diffusion 69, and a light shielding film 66 (see FIGS. 9 and 10) that shields a part of the photoelectric conversion unit 61, the electric charge transfer unit 62L, the electric charge retaining unit 63, the floating diffusion 69, and the read-out circuit 64.

The configurations of the photoelectric conversion unit 61, the electric charge retaining unit 63, the floating diffusion 69, and the read-out circuit 64 included in the second pixel 51L are the same as the configurations of those in the imaging pixel 51A.

The light shielding film 66 of the second pixel 51L has an opening 65L above the photoelectric conversion unit 61. A center of the opening 65L is eccentric to the left in the row direction X with respect to a center of the photoelectric conversion unit 61. The photoelectric conversion unit 61 receives light passed through a left half portion of the pupil area of the imaging optical system in the row direction X through the opening 65L.

In FIG. 8, a portion of the photoelectric conversion unit 61 which overlaps the opening 65L of the light shielding film 66 constitutes a light receiving area 61L of the photoelectric conversion unit 61 of the second pixel 51L.

The electric charge transfer unit 62L transfers the electric charges accumulated in the photoelectric conversion unit 61 to the electric charge retaining unit 63.

As shown in FIGS. 8 and 10, the electric charge transfer unit 62L is constituted by a transfer channel 62bl formed between an area excluding an area indicated by a trajectory in a case where the light receiving area 61L of the photoelectric conversion unit 61 is moved in the column direction Y and the electric charge retaining unit 63, and a transfer electrode 62al formed above the transfer channel 62bl and the electric charge retaining unit 63 through an oxide film 68.

Although the transfer electrode 62al is formed above the electric charge retaining unit 63 in the example of FIGS. 8 and 10, the transfer electrode 62al may be formed above only the transfer channel 62bl.

A voltage applied to the transfer electrode 62al is controlled by the drive circuit 53, and thus, the electric charges accumulated in the photoelectric conversion unit 61 are transferred to the electric charge retaining unit 63 through the transfer channel 62bl.

With the aforementioned configuration, the light receiving area 61R of the first pixel 51R receives light passed through one division area in a case where the pupil area of the imaging optical system of the lens device 40 is divided into two in the row direction X. The light receiving area 61L of the second pixel 51L receives light passed through the other division area of the pupil area of the imaging optical system of the lens device 40.

Accordingly, a correlation operation of the signal read out from the first pixel 51R into the signal line SG and the signal read out from the second pixel 51L into the signal line SG is performed, and thus, it is possible to calculate the phase difference in the row direction X.

In the first pixel 51R of the imaging element 5, the electric charge retaining unit 63 is disposed in the area excluding the area indicated by the trajectory in a case where the photoelectric conversion unit 61 is moved in the row direction X is in plan view of FIG. 5. In the second pixel 51L of the imaging element 5, the electric charge retaining unit 63 is disposed in the area excluding the area indicated by the trajectory in a case where the photoelectric conversion unit 61 is moved in the row direction X in plan view of FIG. 8.

According to this configuration, in each of the first pixel 51R and the second pixel 51L, the electric charge retaining unit 63 having a large occupied area within the pixel is not disposed adjacent to the photoelectric conversion unit 61 in the row direction X. Thus, it is possible to increase a ratio of an occupied width of the photoelectric conversion unit 61 to a width in the row direction X in each of the first pixel 51R and the second pixel 51L, and it is possible to increase the width of the photoelectric conversion unit 61 in the row direction X.

It is possible to increase the width of the light receiving area 61R of the first pixel 51R in the row direction X and the width of the light receiving area 61L of the second pixel 51L in the row direction X by increasing the width of the photoelectric conversion unit 61 in the row direction X. Accordingly, it is possible to improve pixel performance even in the phase-difference detecting pixel having the electric charge retaining unit 63.

The transfer channel 62br of the electric charge transfer unit 62R of the first pixel 51R of the imaging element 5 is disposed in the area excluding the area indicated by the trajectory in a case where the light receiving area 61R is moved in the column direction Y in plan view of FIG. 5. The transfer channel 62bl of the electric charge transfer unit 62L of the second pixel 51L of the imaging element 5 is disposed in the area excluding the area indicated by the trajectory in a case where the light receiving area 61L is moved in the column direction Y in plan view of FIG. 8.

According to this configuration, it is possible to increase a distance between the light receiving area 61R (light receiving area 61L) and the transfer electrode 62ar (transfer electrode 62al) adjacent in the column direction Y. Thus, it is possible to sufficiently secure light shielding performance of the electric charge transfer unit 62R (electric charge transfer unit 62L) even though the opening 65R (opening 65L) extends to the electric charge retaining unit 63, for example.

As stated above, according to the configurations of the first pixel 51R and the second pixel 51L, since it is possible to increase the width of the opening 65R (opening 65L) in the column direction Y, it is possible to improve the sensitivity of the phase-difference detecting pixel.

It is assumed in the example of FIG. 5 that the photoelectric conversion unit 61 and the electric charge retaining unit 63 are arranged in the column direction Y in the first pixel 51R. However, in a case where the electric charge retaining unit 63 is disposed in the area excluding the area indicated by the trajectory in a case where the photoelectric conversion unit 61 is moved in the row direction X in the first pixel 51R, a direction in which the photoelectric conversion unit 61 and the electric charge retaining unit 63 are arranged may be the column direction Y.

For example, the electric charge retaining unit 63 may be shifted in the row direction X in FIG. 5. According to the configuration of FIG. 5, since it is possible to minimize the width of the first pixel 51R in the row direction X, it is advantageous to the reduction of a pixel size.

Similarly, the electric charge retaining unit 63 may be shifted in the row direction X in FIG. 8. According to the configuration of FIG. 8, since it is possible to minimize the width of the second pixel 51L in the row direction X, it is advantageous to the reduction of the pixel size.

The electric charge transfer unit 62 of FIG. 3 may be replaced with the electric charge transfer unit 62R in FIG. 5. Similarly, the electric charge transfer unit 62 of FIG. 3 may be replaced with the electric charge transfer unit 62L in FIG. 8. In such a configuration, it is possible to increase the widths of the light receiving area 61R and the light receiving area 61L in the row direction X, and it is possible to improve the pixel performance of the phase-difference detecting pixel.

Although it has been described above that the phase-difference detecting pixel formed on the light receiving surface 50 of the imaging element 5 detects the phase difference in the row direction X, the phase-difference detecting pixel may detect the phase difference in the column direction Y.

Figure 11:
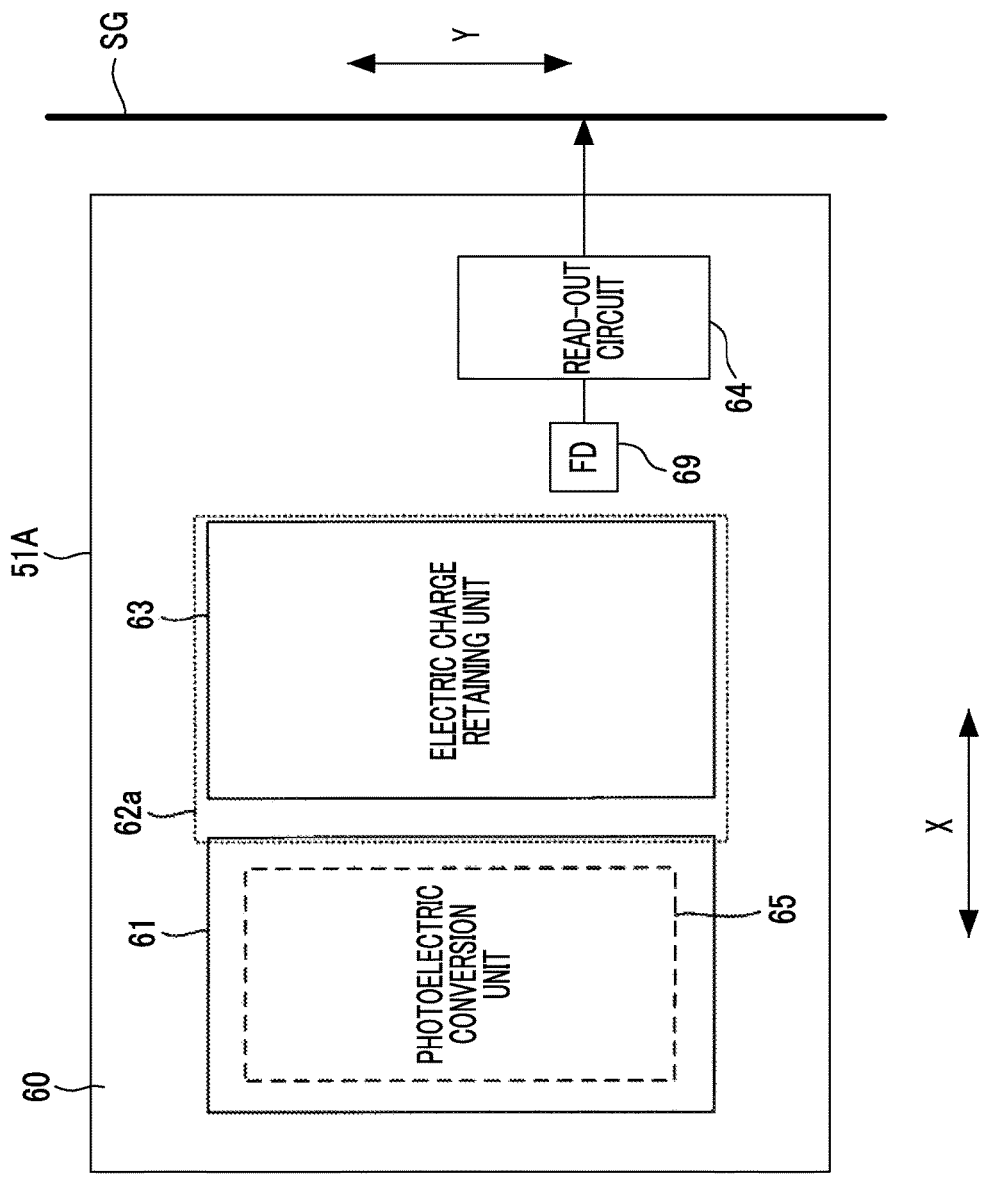
FIG. 11 is a planar schematic diagram showing a modification example of the imaging pixel 51A formed on the light receiving surface 50 shown in FIG. 2.

FIG. 11 is a planar schematic diagram showing a modification example of the imaging pixel 51A formed on the light receiving surface 50 shown in FIG. 2.

The imaging pixel 51A shown in FIG. 11 is acquired by rotating the imaging pixel 51A shown in FIG. 3 to the left by 90 degrees and changing the positions of the floating diffusion 69 and the read-out circuit 64 to positions next to the right side of the electric charge retaining unit 63. The illustration of the transfer channel 62*b* is omitted in FIG. 11.

Figure 12:
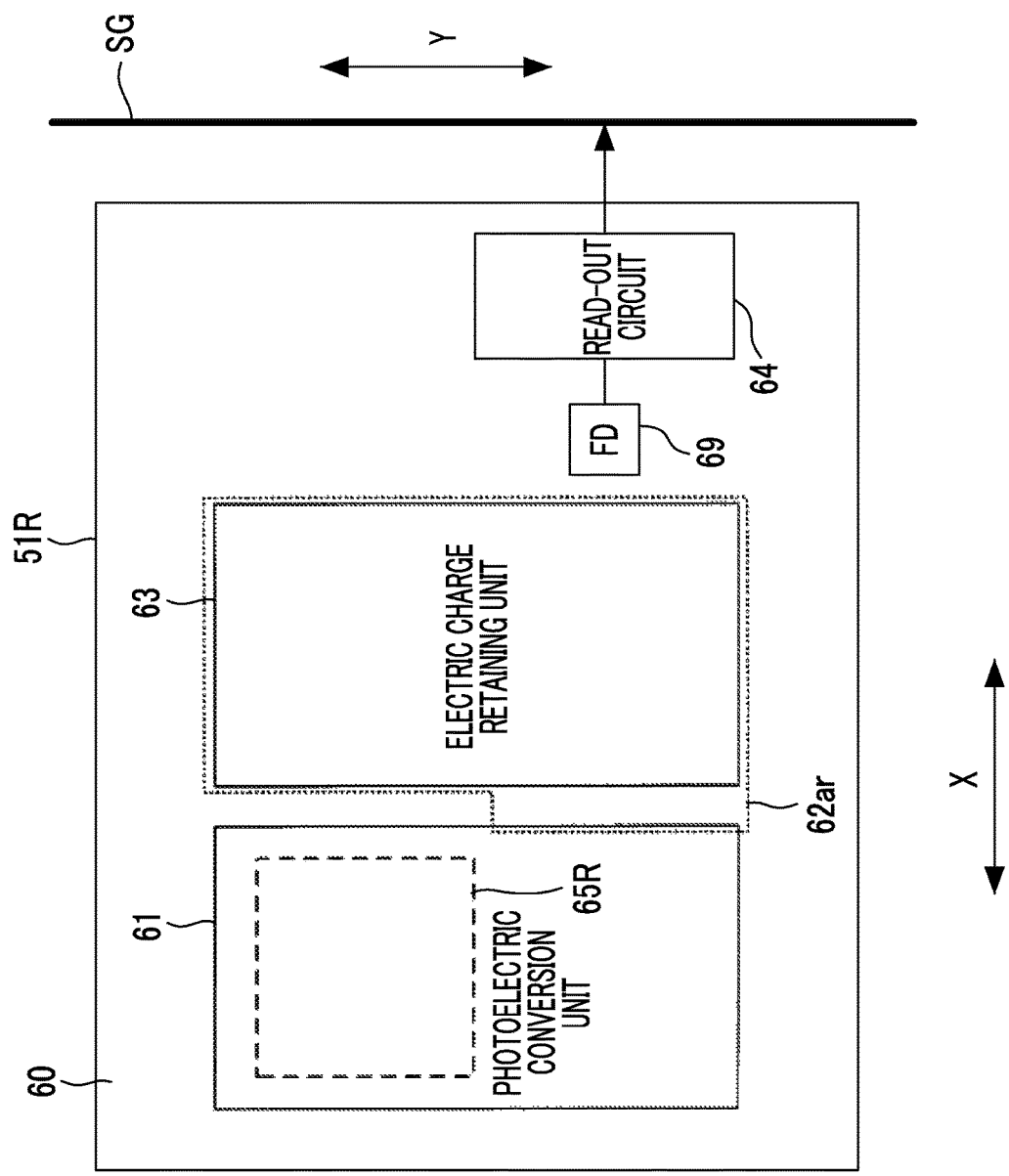
FIG. 12 is a planar schematic diagram showing a modification example of the first pixel 51R formed on the light receiving surface 50 shown in FIG. 2.

FIG. 12 is a planar schematic diagram showing a modification example of the first pixel 51R formed on the light receiving surface 50 shown in FIG. 2.

The first pixel 51R shown in FIG. 12 is acquired by rotating the first pixel 51R shown in FIG. 5 to the left by 90 degrees and changing the positions of the floating diffusion 69 and the read-out circuit 64 to positions next to the right side of the electric charge retaining unit 63. The illustration of the transfer channel 62*br* is omitted in FIG. 12.

Figure 13:
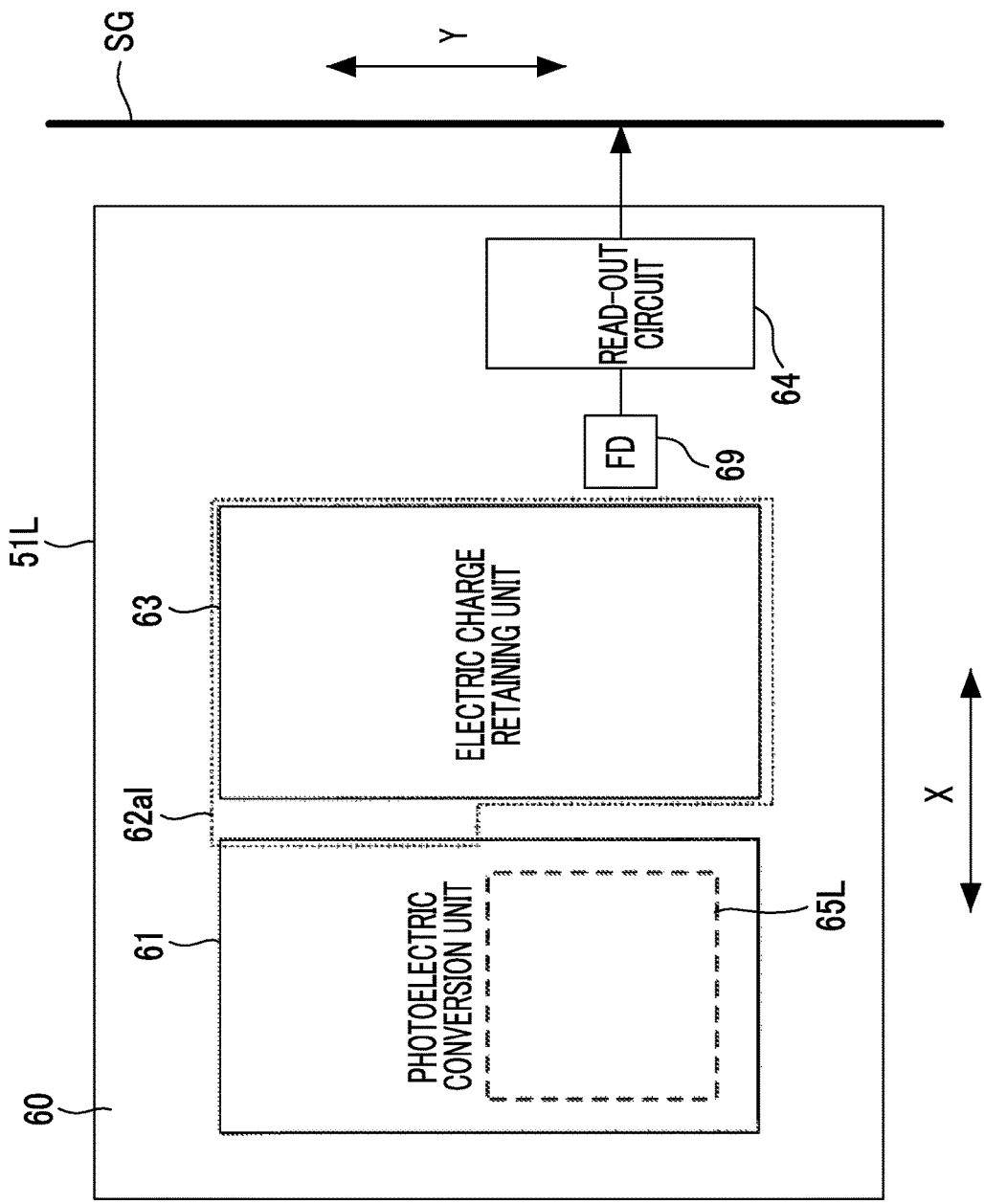
FIG. 13 is a planar schematic diagram showing a modification example of the second pixel 51L formed on the light receiving surface 50 shown in FIG. 2.

FIG. 13 is a planar schematic diagram showing a modification example of the second pixel 51L formed on the light receiving surface 50 shown in FIG. 2.

The second pixel 51L shown in FIG. 13 is acquired by rotating the second pixel 51L shown in FIG. 8 to the left by 90 degrees and changing the positions of the floating diffusion 69 and the read-out circuit 64 to positions next to the right side of the electric charge retaining unit 63. The illustration of the transfer channel 62*bl* is omitted in FIG. 13.

According to the imaging element 5 in which the pixels 51 having the configurations shown in FIGS. 11 to 13 are formed on the light receiving surface 50, it is possible to calculate the phase difference in the column direction Y through the correlation operation of the signal output from the first pixel 51R and the signal output from the second pixel 51L.

In the imaging element 5 of the modification example, it is possible to increase the widths of the light receiving area 61R and the light receiving area 61L in the column direction Y and the widths of the light receiving area 61R and the light receiving area 61L in the row direction X, and it is possible to improve the pixel performance of the phase-difference detecting pixel.

For example, the plurality of imaging pixels 51A shown in FIG. 3 or 11, the plurality of pairs each including the first pixel 51R shown in FIG. 5 and the second pixel 51L shown in FIG. 8, and the plurality of pairs each including the first pixel 51R shown in FIG. 12 and the second pixel 51L shown in FIG. 13 may be arranged on the light receiving surface 50 of the imaging element 5.

According to this configuration, it is possible to calculate the phase difference in the row direction X and the phase difference in the column direction Y, and it is possible to perform high-accurate focusing control.

It is preferable that a lens for concentrating light in the light receiving area is provided above the light receiving area of the photoelectric conversion unit 61 of each pixel 51 of the imaging element 5. Hereinafter, a configuration example of this lens will be described.

Figure 14:
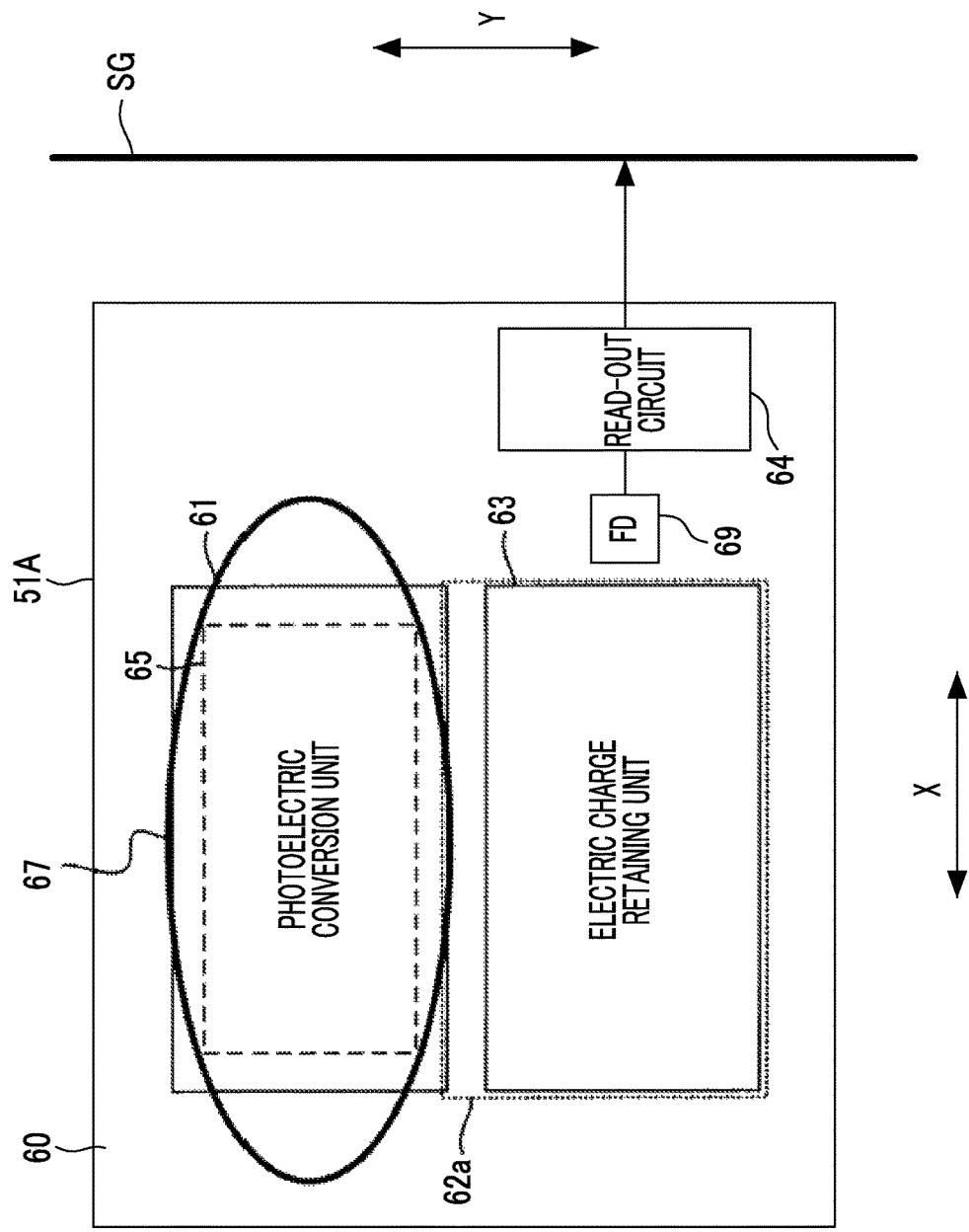
FIG. 14 is a diagram showing an example of a shape of a lens mounted on the imaging pixel 51A shown in FIG. 3.

FIG. 14 is a diagram showing an example of a shape of a lens mounted on the imaging pixel 51A shown in FIG. 3. The illustration of the transfer channel 62*b* is omitted in FIG. 14.

As shown in FIG. 14, a lens 67 is provided above the opening 65 of the light shielding film 66 of the imaging pixel 51A. The lens 67 has an elliptical shape in the example of FIG. 14, and the width in the row direction X which is the detection direction of the phase difference using the first pixel 51R and the second pixel 51L is greater than the width in the column direction Y.

Figure 15:
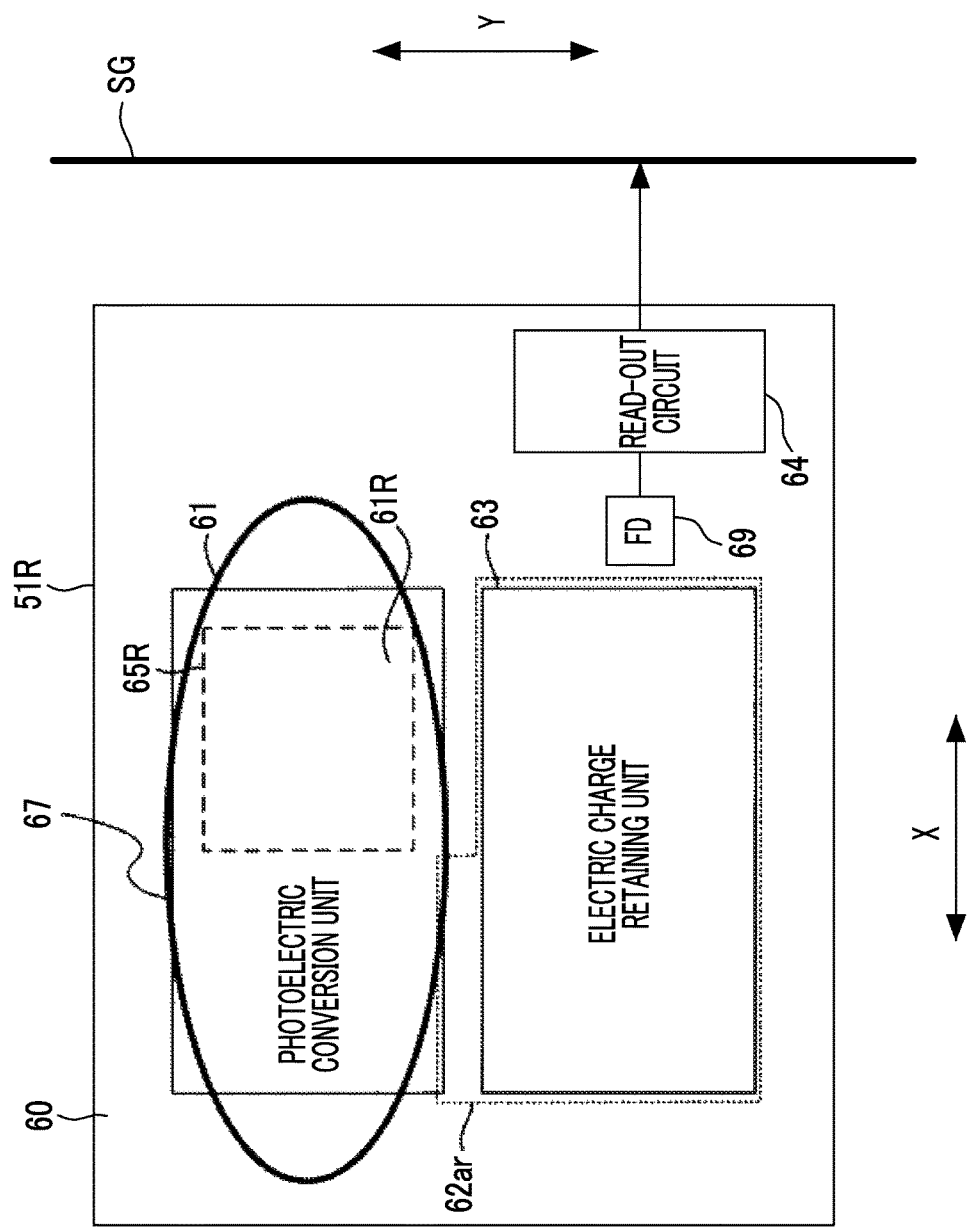
FIG. 15 is a diagram showing an example of a shape of a lens mounted on the first pixel 51R shown in FIG. 5.

FIG. 15 is a diagram showing an example of a shape of a lens mounted on the first pixel 51R shown in FIG. 5. The illustration of the transfer channel 62*br* is omitted in FIG. 14.

As shown in FIG. 15, a lens 67 is provided above the opening 65R of the light shielding film 66 of the first pixel 51R. The lens 67 has an elliptical shape in the example of FIG. 15, and the width in the row direction X which is the detection direction of the phase difference using the first pixel 51R and the second pixel 51L is greater than the width in the column direction Y.

Figure 16:
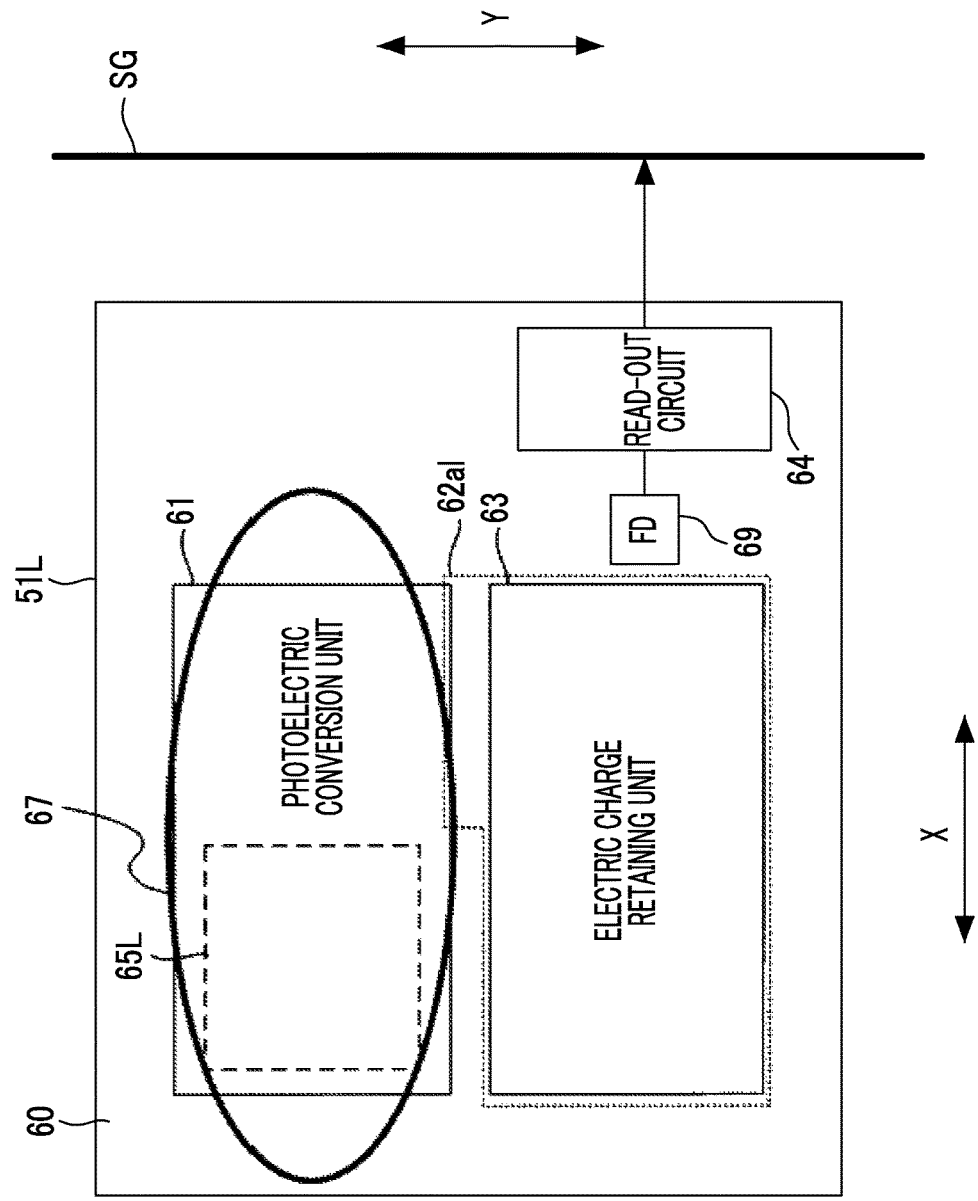
FIG. 16 is a diagram showing an example of a shape of a lens mounted on the second pixel 51L shown in FIG. 8.

FIG. 16 is a diagram showing an example of a shape of a lens mounted on the second pixel 51L shown in FIG. 8. The illustration of the transfer channel 62*bl* is omitted in FIG. 16.

As shown in FIG. 16, a lens 67 is provided above the opening 65L of the light shielding film 66 of the second pixel 51L. The lens 67 has an elliptical shape in the example of FIG. 16, and the width in the row direction X which is the detection direction of the phase difference using the first pixel 51R and the second pixel 51L is greater than the width in the column direction Y.

According to the imaging element 5 in which the pixels 51 having the configurations shown in FIGS. 14 to 16 are formed on the light receiving surface 50, since it is possible to increase a distance between an edge portion of the lens 67 and the electric charge retaining unit 63, it is possible to prevent the light concentrated on the lens 67 from leaking to the electric charge retaining unit 63, and it is possible to improve imaging quality.

Figure 17:
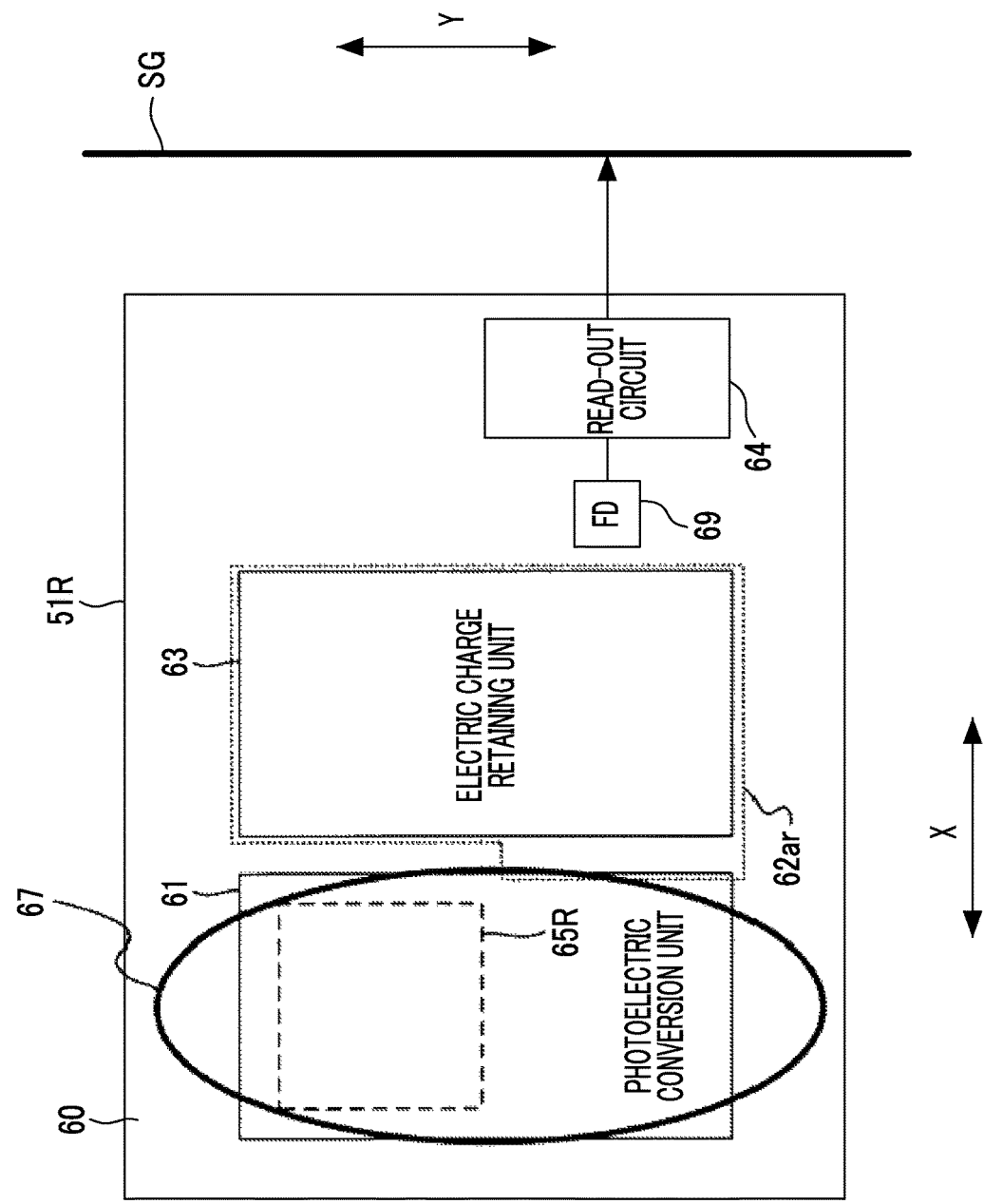
FIG. 17 is a diagram showing an example of a shape of a lens mounted on the first pixel 51R shown in FIG. 12.

FIG. 17 is a diagram showing an example of a shape of a lens mounted on the first pixel 51R shown in FIG. 12. The illustration of the transfer channel 62*br* is omitted in FIG. 17.

As shown in FIG. 17, a lens 67 is provided above the opening 65R of the light shielding film 66 of the first pixel 51R. The lens 67 has an elliptical shape in the example of FIG. 17, and the width in the row direction X which is the detection direction of the phase difference using the first pixel 51R and the second pixel 51L is greater than the width in the column direction Y.

Figure 18:
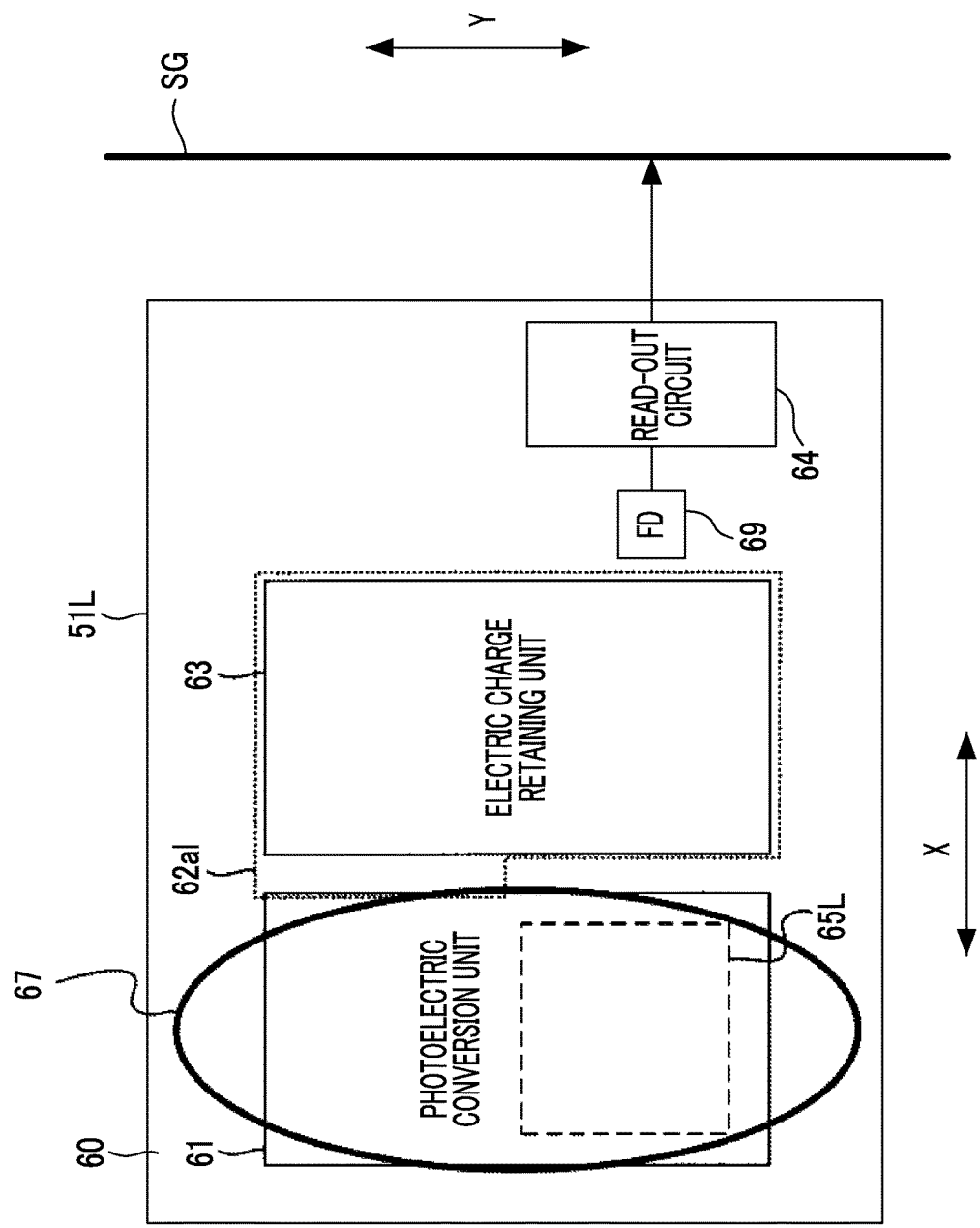
FIG. 18 is a diagram showing an example of a shape of a lens mounted on the second pixel 51L shown in FIG. 13.

FIG. 18 is a diagram showing an example of a shape of a lens mounted on the second pixel 51L shown in FIG. 13. The illustration of the transfer channel 62*bl* is omitted in FIG. 18.

As shown in FIG. 18, a lens 67 is provided above the opening 65L of the light shielding film 66 of the second pixel 51L. The lens 67 has an elliptical shape in the example of FIG. 18, and the width in the row direction X which is the detection direction of the phase difference using the first pixel 51R and the second pixel 51L is greater than the width in the column direction Y.

According to the imaging element 5 in which the pixels 51 having the configurations shown in FIGS. 17 and 18 are formed on the light receiving surface 50, since it is possible to increase a distance between an edge portion of the lens 67 and the electric charge retaining unit 63, it is possible to prevent the light concentrated on the lens 67 from leaking to the electric charge retaining unit 63, and it is possible to improve imaging quality.

The phase-difference detecting pixel formed on the light receiving surface 50 of the imaging element 5 may be a pixel including both the photoelectric conversion unit which receives one of the pair of luminous flux passed through two different portions arranged in the row direction X of the pupil area of the imaging optical system of the lens device 40 and accumulates the electric charges corresponding to the light reception amount, and the photoelectric conversion unit which receives the other one of the pair of luminous flux and accumulates the electric charges corresponding to the light reception amount.

Figure 19:
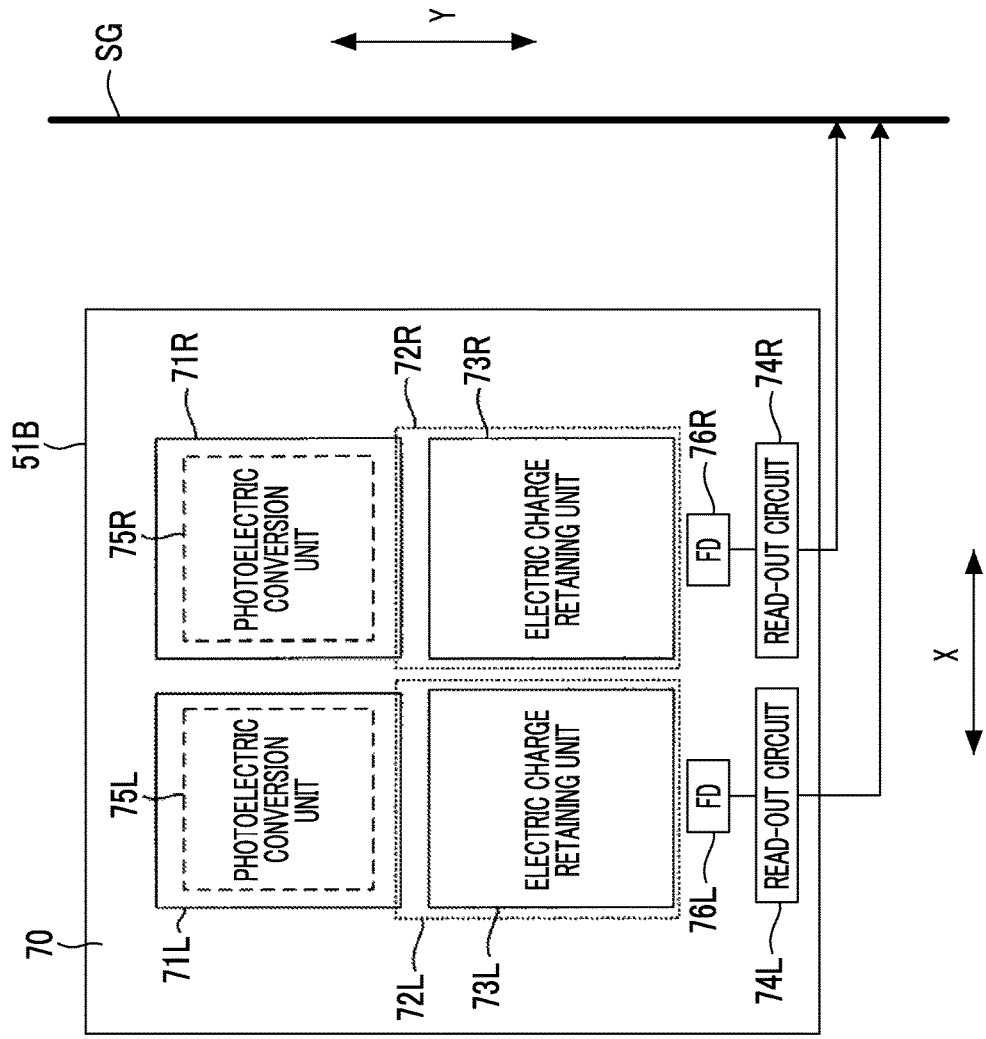
FIG. 19 is a planar schematic diagram showing a modification example of the phase-difference detecting pixel formed on the light receiving surface 50 shown in FIG. 2.

FIG. 19 is a planar schematic diagram showing a modification example of the phase-difference detecting pixel formed on the light receiving surface 50 shown in FIG. 2.

The phase-difference detecting pixel 51B shown in FIG. 19 comprises a photoelectric conversion unit 71R, a photoelectric conversion unit 71L, an electric charge transfer unit 72R, an electric charge transfer unit 72L, an electric charge retaining unit 73R, an electric charge retaining unit 73L, a read-out circuit 74R, a read-out circuit 74L, a floating diffusion 76R, a floating diffusion 76L, and a light shielding film (not shown) that shields these units.

The photoelectric conversion unit 71R and the photoelectric conversion unit 71L are respectively constituted by photodiodes formed within a semiconductor substrate 70. The photoelectric conversion unit 71R and the photoelectric conversion unit 71L are arranged so as to be spaced apart from each other in the row direction X.

A center of the photoelectric conversion unit 71R in the phase-difference detecting pixel 51B is eccentric to the right in the row direction X with respect to a center of the photoelectric conversion unit 61 in the imaging pixel 51A shown in FIG. 3.

A center of the photoelectric conversion unit 71L in the phase-difference detecting pixel 51B is eccentric to the left in the row direction X with respect to a center of the photoelectric conversion unit 61 in the imaging pixel 51A shown in FIG. 3.

The electric charge retaining unit 73R retains the electric charges accumulated in the photoelectric conversion unit 71R. The electric charge retaining unit 73L retains the electric charges accumulated in the photoelectric conversion unit 71L. The electric charge retaining unit 73R and the electric charge retaining unit 73L are respectively constituted by impurity areas formed within the semiconductor substrate 70.

The electric charge retaining unit 73R and the electric charge retaining unit 73L are in the area indicated by the trajectory in a case where the photoelectric conversion unit 71R is moved in the row direction X and the area excluding the area indicated by the trajectory in a case where the photoelectric conversion unit 71L is moved in the row direction X in a plane area of the phase-difference detecting pixel 51B.

In the example of FIG. 19, the electric charge retaining unit 73R is disposed so as to be spaced apart from the photoelectric conversion unit 71R in the column direction Y. The electric charge retaining unit 73L is disposed so as to be spaced apart from the photoelectric conversion unit 71L in the column direction Y.

The electric charge transfer unit 72R is disposed between the photoelectric conversion unit 71R and the electric charge retaining unit 73R, and transfers the electric charge accumulated in the photoelectric conversion unit 71R to the electric charge retaining unit 73R. The electric charge transfer unit 72R has the same configuration as the configuration of the electric charge transfer unit 62, and is constituted by the transfer channel and the transfer electrode.

The electric charge transfer unit 72L is disposed between the photoelectric conversion unit 71L and the electric charge retaining unit 73L, and transfers the electric charges accumulated in the photoelectric conversion unit 71L to the electric charge retaining unit 73L. The electric charge transfer unit 72L has the same configuration as the configuration of the electric charge transfer unit 62, and is constituted by the transfer channel and the transfer electrode.

The electric charges retained in the electric charge retaining unit 73R are transferred to the floating diffusion 76R, and the transferred electric charges are converted into a voltage.

The electric charges retained in the electric charge retaining unit 73L are transferred to the floating diffusion 76L, and the transferred electric charges are converted into a voltage.

The read-out circuit 74R is a circuit that converts the electric charges retained in the electric charge retaining unit 73R into a signal and reads out the signal into a signal line SG, and has, for example, the aforementioned configuration.

The read-out circuit 74L is a circuit that converts the electric charges retained in the electric charge retaining unit 73L into a signal and reads out the signal into the signal line SG, and has, for example, the aforementioned configuration.

A light shielding film (not shown) is formed above the photoelectric conversion unit 71R, the photoelectric conversion unit 71L, the electric charge transfer unit 72R, the electric charge transfer unit 72L, the electric charge retaining unit 73R, the electric charge retaining unit 73L, the read-out circuit 74R, the read-out circuit 74L, the floating diffusion 76R, and the floating diffusion 76L.

The light shielding film has an opening 75R above the photoelectric conversion unit 71R, and has an opening 75L above the photoelectric conversion unit 71L.

A center of the opening 75R matches a center of the photoelectric conversion unit 71R. A center of the opening 75L matches a center of the photoelectric conversion unit 71L.

In the phase-difference detecting pixel 51B having the aforementioned configuration, the photoelectric conversion unit 71R functions as a photoelectric conversion unit which receives one of the pair of luminous flux passed through two different portions arranged in the row direction X of the pupil area of the imaging optical system of the lens device 40 and accumulates the electric charges corresponding to the light reception amount. The photoelectric conversion unit 71L functions as a photoelectric conversion unit that receives the other one of the pair of luminous flux and accumulates the electric charges corresponding to the light reception amount.

Accordingly, a unit constituted by the photoelectric conversion unit 71R, the electric charge transfer unit 72R, the electric charge retaining unit 73R, the read-out circuit 74R, and the floating diffusion 76R functions as the first pixel 51R shown in FIG. 5.

A unit constituted by the photoelectric conversion unit 71L, the electric charge transfer unit 72L, the electric charge retaining unit 73L, the read-out circuit 74L, and the floating diffusion 76L functions as the second pixel 51L shown in FIG. 8.

According to the phase-difference detecting pixel 51B shown in FIG. 19, the electric charge retaining unit 73R and the electric charge retaining unit 73L having large occupied areas within the pixel are not arranged adjacent to the photoelectric conversion unit 71R and the photoelectric conversion unit 71L in the row direction.

Thus, it is possible to increase a ratio of the occupied widths of the photoelectric conversion unit 71R and the photoelectric conversion unit 71L in the widths in the row direction X, and it is possible to increase the widths of the photoelectric conversion unit 71R and the photoelectric conversion unit 71L in the row direction X. Accordingly, it is possible to improve the pixel performance of the phase-difference detecting pixel 51B.

In a configuration in which a pair of photoelectric conversion units for detecting the phase difference is disposed within one pixel 51, there is no room in the space within the pixel. Thus, the configuration shown in FIG. 19 is particularly effective.

As the configuration of the phase-difference detecting pixel formed on the light receiving surface 50 shown in FIG. 2, a configuration in which the phase-difference detecting pixel 51B shown in FIG. 19 is rotated to the left by 90 degrees may be used. According to this configuration, it is possible to detect the phase difference in the column direction Y with high accuracy.

In the phase-difference detecting pixel 51B shown in FIG. 19, one lens of which a width in the row direction X is greater than the width in the column direction Y is mounted above the opening 75R and the opening 75L and the light is concentrated on the photoelectric conversion unit 71R and the photoelectric conversion unit 71L. Accordingly, it is possible to prevent the electric charges from leaking to the electric charge retaining unit 73R and the electric charge retaining unit 73L, and it is possible to improve imaging quality.

In the phase-difference detecting pixel 51B shown in FIG. 19, for example, the electric charges retained in the electric charge retaining unit 73R and the electric charges retained in the electric charge retaining unit 73L may be simultaneously transferred to the floating diffusion 76L of the read-out circuit 74R, the potential of the floating diffusion 76L may be converted into the signal, and the signal is read out into the signal line SG.

With this configuration, the phase-difference detecting pixel 51B can function as the imaging pixel 51A shown in FIG. 3. As stated above, in a case where the phase-difference detecting pixel 51B functions as the imaging pixel, only the phase-difference detecting pixels 51B may be arranged in two dimensions on the light receiving surface 50.

It has been described above that the digital camera is used as the example of the imaging device. Hereinafter, an embodiment of a smartphone with a camera will be described as the imaging device.

Figure 20:
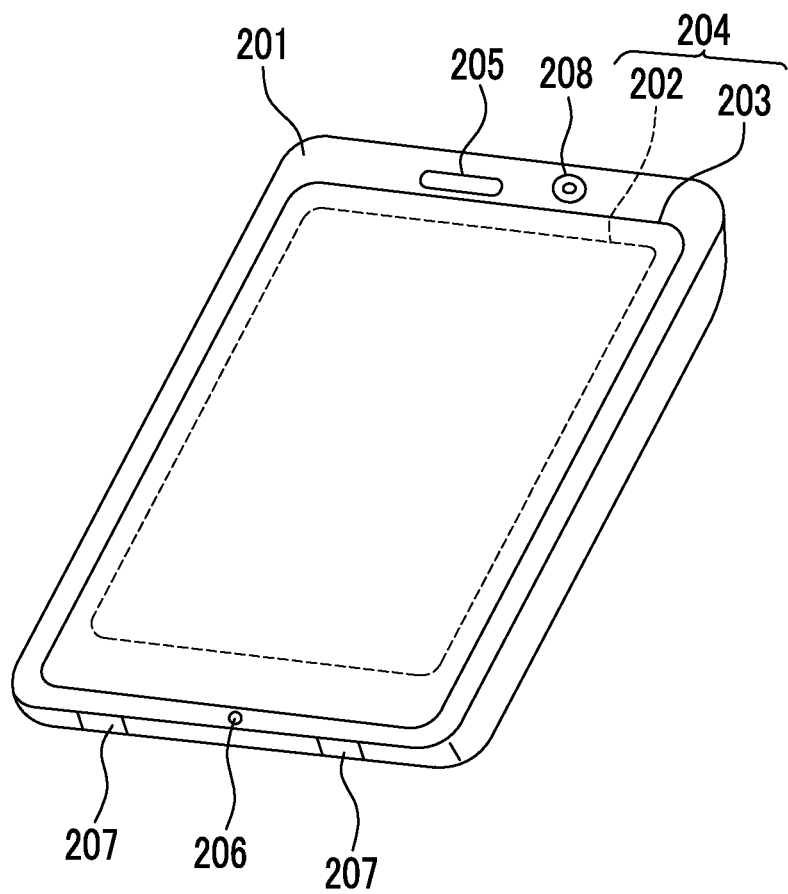
FIG. 20 shows an external appearance of a smartphone 200 which is an embodiment of the imaging device of the present invention.

FIG. 20 shows an external appearance of a smartphone 200 which is an embodiment of the imaging device of the present invention.

The smartphone 200 shown in FIG. 20 has a flat casing 201, and comprises a display input unit 204 in which a display panel 202 as a display unit and a manipulation panel 203 as an input unit are integrally formed on one surface of the casing 201.

Such a casing 201 comprises a speaker 205, a microphone 206, a manipulation unit 207, and a camera unit 208.

The configuration of the casing 201 is not limited thereto. For example, the display unit and the input unit may be independent of each other, or may have a folding structure or a slide mechanism.

Figure 21:
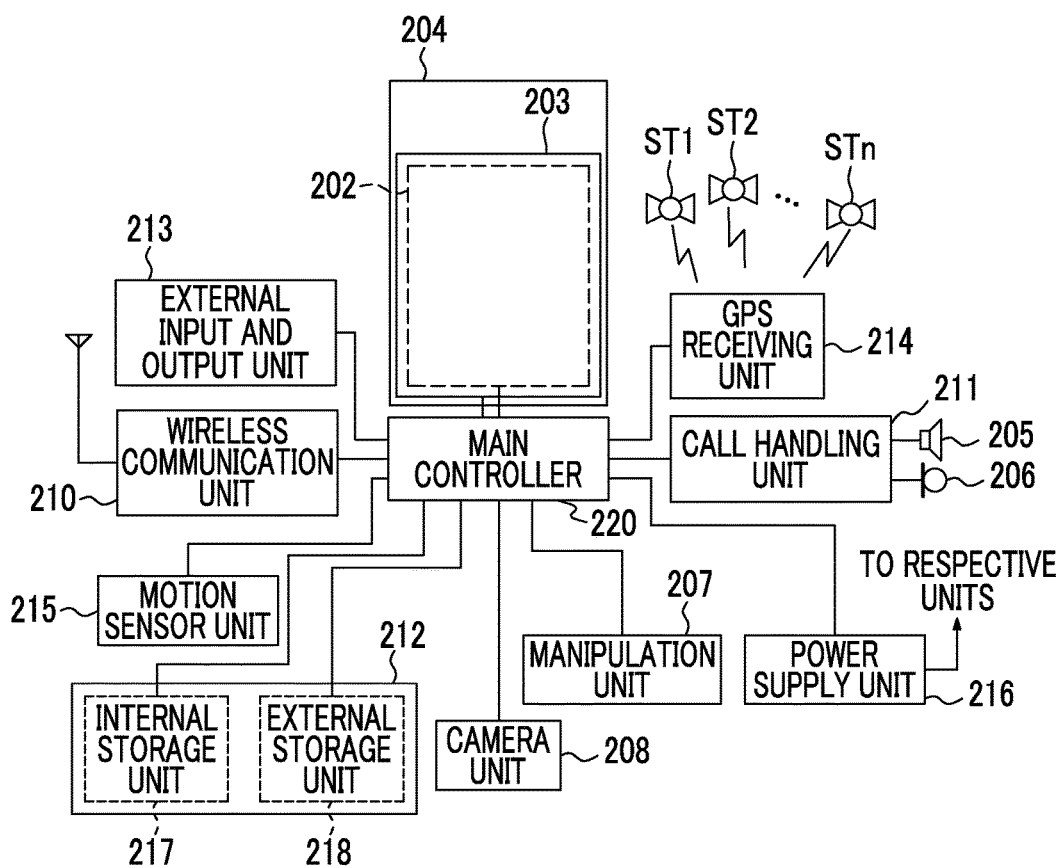
FIG. 21 is a block diagram showing a configuration of the smartphone 200 shown in FIG. 20.

FIG. 21 is a block diagram showing the configuration of the smartphone 200 shown in FIG. 20.

As shown in FIG. 21, principal components of the smartphone comprise a wireless communication unit 210, a display input unit 204, a call handling unit 211, a manipulation unit 207, a camera unit 208, a storage unit 212, an external input and output unit 213, a Global Positioning System (GPS) receiving unit 214, a motion sensor unit 215, a power supply unit 216, and a main controller 220.

Principal functions of the smartphone 200 comprise a wireless communication function of performing mobile wireless communication through a base station device BS (not shown) and a mobile communication network NW (not shown).

The wireless communication unit 210 performs wireless communication with a base station device BS in the mobile communication network NW according to a command of the main controller 220. With the use of the wireless communication, the transmission and reception of various kinds of file data, such as voice data and image data, and electronic mail data, or the reception of Web data and streaming data are performed.

The display input unit 204 is a so-called touch panel which displays images (still images and moving images) or character information to visually transfer information to the user and detects a user's manipulation on the displayed information under the control of the main controller 220, and comprises the display panel 202 and the manipulation panel 203.

The display panel 202 uses a liquid crystal display (LCD) or an organic electro-luminescence display (OELD) as a display device.

The manipulation panel 203 is a device which is placed such that an image displayed on a display surface of the display panel 202 is visible, and detects one or a plurality of coordinates of a manipulation with a user's finger or a stylus. In a case where the device is manipulated with the user's finger or the stylus, a detection signal due to the manipulation is output to the main controller 220. Next, the main controller 220 detects a manipulation position (coordinates) on the display panel 202 based on the received detection signal.

As shown in FIG. 20, although the display panel 202 and the manipulation panel 203 of the smartphone 200 illustrated as an embodiment of the imaging device of the present invention are integrated to constitute the display input unit 204, the manipulation panel 203 is arranged to completely cover the display panel 202.

In a case where this arrangement is employed, the manipulation panel 203 may have a function of detecting a user's manipulation even in an area outside the display panel 202. In other words, the manipulation panel 203 may comprise a detection area (hereinafter, referred to as a display area) for an overlapped portion which overlaps the display panel 202 and a detection area (hereinafter, referred to as a non-display area) for an outer edge portion which does not overlap the display panel 202 other than the display area.

Although the size of the display area may completely match the size of the display panel 202, it is not necessary to match both of the size of the display area and the size of the display panel. The manipulation panel 203 may comprise two sensitive areas including an outer edge portion and an inner portion other than the outer edge portion. The width of the outer edge portion is appropriately designed according to the size of the casing 201 or the like.

As a position detection system which is employed in the manipulation panel 203, a matrix switching system, a resistive film system, a surface acoustic wave system, an infrared system, an electromagnetic induction system, an electrostatic capacitance system, and the like are exemplified, and any system can be employed.

The call handling unit 211 comprises the speaker 205 and the microphone 206, converts voice of the user input through the microphone 206 to voice data processable in the main controller 220 and outputs voice data to the main controller 220, or decodes voice data received by the wireless communication unit 210 or the external input and output unit 213 and outputs voice from the speaker 205.

As shown in FIG. 20, for example, the speaker 205 can be mounted on the same surface as the surface on which the display input unit 204 is provided, and the microphone 206 can be mounted on the side surface of the casing 201.

The manipulation unit 207 is a hardware key using a key switch or the like, and receives a command from the user. For example, as shown in FIG. 20, the manipulation unit 207 is a push button-type switch which is mounted on the side surface of the casing 201 of the smartphone 200, and is turned on by being depressed with a finger or the like and is turned off by restoration force of the panel or the like in a case where the finger is released.

The storage unit 212 stores a control program or control data of the main controller 220, application software, address data in association with the name, telephone number, and the like of a communication partner, data of transmitted and received electronic mail, Web data downloaded by Web browsing, and downloaded content data, and temporarily stores streaming data or the like. The storage unit 212 is constituted by an internal storage unit 217 embedded in the smartphone and an external storage unit 218 having a slot for an attachable and detachable external memory.

The internal storage unit 217 and the external storage unit 218 constituting the storage unit 212 are realized using a memory (for example, a microSD (Registered Trademark) memory or the like), such as a flash memory type, a hard disk type, a multimedia card micro type, or a card type, or a storage medium, such as a random access memory (RAM) or a read only memory (ROM).

The external input and output unit 213 plays a role of an interface with all external devices connected to the smartphone 200, and is provided for direct or indirect connection to other external devices through communication or the like (for example, universal serial bus (USB), IEEE 1394, or the like), or a network (for example, the Internet, wireless LAN, Bluetooth (Registered trademark), radio frequency identification (RFID), infrared communication (Infrared Data Association: IrDA) (Registered Trademark), Ultra Wideband (UWB) (Registered Trademark), ZigBee (Registered Trademark), or the like).

The external devices connected to the smartphone 200 are, for example, a wired or wireless headset, a wired or wireless external charger, a wired or wireless data port, a memory card connected through a card socket, a subscriber identity module (SIM) card, a user identity module (UIM) card, an external audio-video device connected through an audio-video input and output (I/O) terminal, an external audio-video device connected in a wireless manner, a smartphone connected in a wired or wireless manner, a personal computer connected in a wired or wireless manner, a PDA connected in a wired or wireless manner, an earphone in a wired or wireless manner, and the like.

The external input and output unit 213 transfers data transmitted from the external devices to the respective components in the smartphone 200 or transmits data in the smartphone 200 to the external devices.

The GPS receiving unit 214 receives GPS signals transmitted from GPS satellites ST1 to STn according to a command of the main controller 220, executes positioning calculation processing based on a plurality of received GPS signals, and detects the position of the smartphone 200 having latitude, longitude, and altitude.

In a case where positional information can be acquired from the wireless communication unit 210 or the external input and output unit 213 (for example, a wireless LAN), the GPS receiving unit 214 can detect the position using the positional information.

The motion sensor unit 215 comprises, for example, a three-axis acceleration sensor or the like, and detects physical motion of the smartphone 200 according to a command of the main controller 220. The moving direction or acceleration of the smartphone 200 is detected by detecting physical motion of the smartphone 200. The detection result is output to the main controller 220.

The power supply unit 216 supplies electric power stored in a battery (not shown) to the respective units of the smartphone 200 according to a command of the main controller 220.

The main controller 220 comprises a microprocessor, operates according to the control program or control data stored in the storage unit 212, and integrally controls the respective units of the smartphone 200.

The main controller 220 has a mobile communication control function of controlling respective units of a communication system in order to perform voice communication or data communication through the wireless communication unit 210, and an application processing function.

The application processing function is realized by the main controller 220 operating according to application software stored in the storage unit 212.

The application processing function is, for example, an infrared communication function of controlling the external input and output unit 213 to perform data communication with a device facing the smartphone 200, an electronic mail function of transmitting and receiving electronic mail, a Web browsing function of browsing Web pages, or the like.

The main controller 220 has an image processing function of displaying video on the display input unit 204, or the like based on image data (still image or moving image data), such as received data or downloaded streaming data.

The image processing function refers to a function of the main controller 220 decoding image data, performing image processing on the decoding result, and displaying an image on the display input unit 204.

The main controller 220 executes display control on the display panel 202 and manipulation detection control for detecting a user's manipulation through the manipulation unit 207 and the manipulation panel 203. With the execution of the display control, the main controller 220 displays an icon for activating application software or a software key, such as a scroll bar, or displays a window for creating electronic mail.

The scroll bar refers to a software key for receiving a command to move a display portion of an image which is too large to fit into the display area of the display panel 202.

With the execution of the manipulation detection control, the main controller 220 detects a user's manipulation through the manipulation unit 207, receives a manipulation on the icon or an input of a character string in an entry column of the window through the manipulation panel 203, or receives a scroll request of a display image through the scroll bar.

In addition, with the execution of the manipulation detection control, the main controller 220 has a touch panel control function of determining whether a manipulation position on the manipulation panel 203 is the superimposed portion (display area) overlapping the display panel 202 or the outer edge portion (non-display area) not overlapping the display panel 202 other than the display area, and controlling the sensitive area of the manipulation panel 203 or the display position of the software key.

The main controller 220 may detect a gesture manipulation on the manipulation panel 203 and may execute a function set in advance according to the detected gesture manipulation. The gesture manipulation is not a conventional simple touch manipulation, but means a manipulation to render a track with a finger or the like, a manipulation to simultaneously designate a plurality of positions, or a manipulation to render a track for at least one of a plurality of positions by combining the above-described manipulations.

The camera unit 208 includes the configuration other than the external memory controller 20, the storage medium 21, the display unit 23, the display driver 22, and the manipulation unit 14 in the digital camera shown in FIG. 1.

Captured image data generated by the camera unit 208 can be stored in the storage unit 212 or can be output through the external input and output unit 213 or the wireless communication unit 210.

In the smartphone 200 shown in FIG. 20, although the camera unit 208 is mounted on the same surface as the display input unit 204, the mounting position of the camera unit 208 is not limited thereto, and the camera unit 208 may be mounted on the rear surface of the display input unit 204.

The camera unit 208 can be used for various functions of the smartphone 200. For example, the image acquired by the camera unit 208 is displayed on the display panel 202, or an image of the camera unit 208 can be used as one of a manipulation input of the manipulation panel 203.

In a case where the GPS receiving unit 214 detects the position, the position may be detected with reference to an image from the camera unit 208. In addition, the optical axis direction of the camera unit 208 of the smartphone 200 can be determined or a current use environment may be determined with reference to an image from the camera unit 208 without using the three-axis acceleration sensor or in combination with the three-axis acceleration sensor. Of course, an image from the camera unit 208 may be used in application software.

In addition, image data of a still image or a moving image may be attached with positional information acquired by the GPS receiving unit 214, voice information (which may be converted to text information through voice-text conversion by the main controller or the like) acquired by the microphone 206, posture information acquired by the motion sensor unit 215, or the like and can be stored in the storage unit 212, or may be output through the external input and output unit 213 or the wireless communication unit 210.

As described above, the following matters are disclosed in this specification.

(1) There is provided an imaging element that images a subject through an imaging optical system. The imaging element comprises a plurality of pairs each including a photoelectric conversion unit which is formed within a semiconductor substrate, receives one of a pair of luminous flux passed through different portions arranged in one direction of a pupil area of the imaging optical system, and accumulates electric charges corresponding to a light reception amount, and a photoelectric conversion unit which is formed within the semiconductor substrate, receives the other one of the pair of luminous flux, and accumulates electric charges corresponding to a light reception amount. Each of pixels including the photoelectric conversion units constituting the pair includes an electric charge retaining unit which retains the electric charges transferred from the photoelectric conversion unit within the pixel and from which a signal corresponding to the electric charges is read out by a read-out circuit, and in a state in which the semiconductor substrate is viewed in a perpendicular direction, the electric charge retaining unit included in the pixel is disposed in an area excluding an area of the pixel indicated by a trajectory in a case where the photoelectric conversion unit included in the pixel is moved in the one direction.

(2) In the imaging element according to (1), the photoelectric conversion unit and the electric charge retaining unit of the pixel are arranged in a direction perpendicular to the one direction.

(3) In the imaging element according to (1) or (2), all the pixels each include a first pixel including the photoelectric conversion unit that receives the one of the pair of luminous flux and accumulates the electric charges corresponding to the light reception amount, and a second pixel including the photoelectric conversion unit which receives the other one of the pair of luminous flux and accumulates the electric charges corresponding to the light reception amount, each of the first pixel and the second pixel includes a transfer channel formed within the semiconductor substrate and a transfer electrode formed above the transfer channel in order to transfer the electric charges accumulated in the photoelectric conversion unit to the electric charge retaining unit, and a light shielding film that shields an area excluding a light receiving area of the photoelectric conversion unit, the electric charge retaining unit, and the transfer electrode, and in a state in which the semiconductor substrate is viewed in the perpendicular direction, the transfer channel is formed in an area excluding an area of the pixel indicated by a trajectory in a case where the light receiving area of the photoelectric conversion unit is moved in a direction perpendicular to the one direction.

(4) In the imaging element according to (3), each of the first pixel and the second pixel has a lens disposed above the photoelectric conversion unit in order to concentrate light in the light receiving area of the photoelectric conversion unit, and a width of the lens in the one direction is greater than a width in the direction perpendicular to the one direction.

(5) In the imaging element according to (1), all the pixels each include a first pixel including the photoelectric conversion unit that receives the one of the pair of luminous flux and accumulates the electric charges corresponding to the light reception amount, and a second pixel including the photoelectric conversion unit which receives the other one of the pair of luminous flux and accumulates the electric charges corresponding to the light reception amount, each of the first pixel and the second pixel has a lens disposed above the photoelectric conversion unit in order to concentrate light in the light receiving area of the photoelectric conversion unit, and a width of the lens in the one direction is greater than a width in a direction perpendicular to the one direction.

(6) There is provided an imaging device comprising the imaging element according to any one of (1) to (5).

According to the present invention, it is possible to provide an imaging device capable of performing high-accurate focusing control.

Although the present invention has been described in conjunction with a specific embodiment, the present invention is not limited to the embodiment, and may be variously changed without departing from the technical spirit of the invention disclosed herein.

This application is based on Japanese Patent Application (2016-188705), filed Sep. 27, 2016, the content of which is incorporated herein.

EXPLANATION OF REFERENCES

1: imaging lens
2: stop
4: lens controller
5: imaging element
40: lens device
50: light receiving surface
51: pixel
51A: imaging pixel
51R: first pixel
51L: second pixel
51B: phase-difference detecting pixel
52: pixel row
53: drive circuit
54: signal processing circuit
X: row direction
Y: column direction
8: lens drive unit
9: stop drive unit
10: imaging element drive unit
11: system controller
14: manipulation unit
17: digital signal processing unit
20: external memory controller
21: storage medium
22: display driver
23: display unit
24: control bus
25: data bus
60, 70: semiconductor substrate
61, 71R, 71L: photoelectric conversion unit
62, 62R, 62L, 72R, 72L: electric charge transfer unit
62a, 62ar, 62al: transfer electrode
62b, 62br, 62bl: transfer channel
63, 73R, 73L: electric charge retaining unit
64, 74R, 74L: read-out circuit
65, 65R, 65L, 75R, 75L: opening
69, 76R, 76L: floating diffusion
66: light shielding film
67: lens
68: oxide film
SG: signal line
200: smartphone
201: casing
202: display panel
203: manipulation panel
204: display input unit
205: speaker
206: microphone
207: manipulation unit
208: camera unit
210: wireless communication unit
211: call handling unit
212: storage unit
213: external input and output unit
214: GPS receiving unit
215: motion sensor unit
216: power supply unit
217: internal storage unit
218: external storage unit
220: main controller
ST1 to STn: GPS satellite

What is claimed is:

1. An imaging element that images a subject through an imaging optical system, the imaging element comprising: a plurality of pairs provided within a semiconductor substrate, each of the pairs comprising a first pixel comprising a photoelectric conversion unit which receives one of a pair of luminous flux passed through different portions arranged in one direction of a pupil area of the imaging optical system, and accumulates electric charges corresponding to a light reception amount, and a second pixel comprising a photoelectric conversion unit which receives other of the pair of luminous flux, and accumulates electric charges corresponding to a light reception amount, wherein each of the first pixel and the second pixel comprises: an electric charge retaining unit which retains the electric charges transferred from the photoelectric conversion unit in the each of the first pixel and the second pixel and from which a signal corresponding to the electric charges is read out by a read-out circuit; a transfer channel which is provided within the semiconductor substrate and is to transfer the electric charges accumulated in the photoelectric conversion unit to the electric charge retaining unit; a transfer electrode provided above the transfer channel; and a light shielding film that shields an area, excluding a light receiving area, of the photoelectric conversion unit, the electric charge retaining unit, and the transfer electrode, in a state of being viewed in a one direction perpendicular to the semiconductor substrate, the photoelectric conversion unit and the electric charge retaining unit included in each of the first pixel and the second pixel are arranged perpendicular to the one direction of the pupil area, and in a state of being viewed in the one direction perpendicular to the semiconductor substrate, the transfer channel is provided in an area excluding an area of the first pixel and the second pixel indicated by a trajectory in a case where the light receiving area of the photoelectric conversion unit is moved perpendicular to the one direction of the pupil area.

2. The imaging element according to claim 1, wherein each of the first pixel and the second pixel has a lens disposed above the photoelectric conversion unit to concentrate light to the light receiving area of the photoelectric conversion unit, and a width of the lens in the one direction of the pupil area is greater than a width of the lens in the direction perpendicular to the one direction of the pupil area.

3. An imaging device comprising:
the imaging element according to claim 1.

4. An imaging device comprising:
the imaging element according to claim 2.

* * * * *